US007323095B2

(12) United States Patent
Hsu et al.

(10) Patent No.: US 7,323,095 B2
(45) Date of Patent: Jan. 29, 2008

(54) INTEGRATED MULTI-STEP GAP FILL AND ALL FEATURE PLANARIZATION FOR CONDUCTIVE MATERIALS

(75) Inventors: Wei-Yung Hsu, Santa Clara, CA (US); Liang-Yuh Chen, Foster City, CA (US); Ratson Morad, Palo Alto, CA (US); Daniel A. Carl, Pleasanton, CA (US); Sasson Somekh, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 671 days.

(21) Appl. No.: 10/792,069

(22) Filed: Mar. 3, 2004

(65) Prior Publication Data

US 2004/0266085 A1    Dec. 30, 2004

Related U.S. Application Data

(62) Division of application No. 09/739,139, filed on Dec. 18, 2000, now Pat. No. 6,896,776.

(51) Int. Cl.
*C25D 21/00*    (2006.01)
*C25D 7/12*    (2006.01)

(52) U.S. Cl. .................. 205/80; 205/93; 205/103; 205/143; 205/663

(58) Field of Classification Search .......... 205/80, 205/87, 93, 103, 104, 143, 663
See application file for complete search history.

(56) References Cited

U.S. PATENT DOCUMENTS 2,582,020 A    1/1952    Emery
3,162,588 A    1/1952    Emery
3,239,441 A    3/1966    Marosi
3,448,023 A    6/1969    Bell
3,873,512 A    3/1975    Latanision (Continued)

FOREIGN PATENT DOCUMENTS

DE    4324330 A1    2/1994

(Continued)

OTHER PUBLICATIONS

Annex to Form PCT/ISA/206, dated Apr. 15, 2004, for PCT/US01/46449.

(Continued)

*Primary Examiner*—Susy Tsang-Foster
*Assistant Examiner*—W. T. Leader
(74) *Attorney, Agent, or Firm*—Townsend and Townsend and Crew

(57) ABSTRACT

A method and apparatus is provided for depositing and planarizing a material layer on a substrate. In one embodiment, an apparatus is provided which includes a partial enclosure, a permeable disc, a diffuser plate and optionally an anode. A substrate carrier is positionable above the partial enclosure and is adapted to move a substrate into and out of contact or close proximity with the permeable disc. The partial enclosure and the substrate carrier are rotatable to provide relative motion between a substrate and the permeable disc. In another aspect, a method is provided in which a substrate is positioned in a partial enclosure having an electrolyte therein at a first distance from a permeable disc. A current is optionally applied to the surface of the substrate and a first thickness is deposited on the substrate. Next, the substrate is positioned closer to the permeable disc. During the deposition, the partial enclosure and the substrate are rotated relative one another.

19 Claims, 15 Drawing Sheets

U.S. PATENT DOCUMENTS

| | | | |
|---|---|---|---|
| 4,125,444 A | 11/1978 | Inoue | |
| 4,263,113 A | 4/1981 | Bernard | |
| 4,663,005 A | 5/1987 | Edson | |
| 4,666,683 A | 5/1987 | Brown et al. | |
| 4,713,149 A | 12/1987 | Hoshino | |
| 4,793,895 A | 12/1988 | Kaanta et al. | |
| 4,934,102 A | 12/1988 | Kaunta et al. | |
| 4,839,005 A | 6/1989 | Katsumoto et al. | |
| 4,954,141 A | 9/1990 | Takiyama et al. | |
| 4,992,135 A | 2/1991 | Doan | |
| 5,002,645 A | 3/1991 | Eastland et al. | |
| 5,032,238 A | 7/1991 | Ishimura et al. | |
| 5,096,550 A | 3/1992 | Mayer et al. | |
| 5,114,548 A | 5/1992 | Rhoades | |
| 5,129,981 A | 7/1992 | Wang et al. | |
| 5,136,817 A | 8/1992 | Tabata et al. | |
| 5,209,816 A | 5/1993 | Yu et al. | |
| 5,217,586 A | 6/1993 | Datta et al. | |
| 5,225,034 A | 7/1993 | Yu et al. | |
| 5,256,565 A | 10/1993 | Bernhardt et al. | |
| 5,257,478 A | 11/1993 | Hyde | |
| 5,340,370 A | 8/1994 | Cadien et al. | |
| 5,391,258 A | 2/1995 | Brandacaleoni et al. | |
| 5,534,106 A | 7/1996 | Cote et al. | |
| 5,543,032 A | 8/1996 | Datta et al. | |
| 5,567,200 A | 10/1996 | Swartzendruber | |
| 5,567,300 A | 10/1996 | Datta et al. | |
| 5,575,706 A | 11/1996 | Tsai et al. | |
| 5,578,362 A | 11/1996 | Reinhardt et al. | |
| 5,624,300 A | 4/1997 | Kishii et al. | |
| 5,770,095 A | 6/1998 | Sasaki et al. | |
| 5,783,489 A | 7/1998 | Kaufman et al. | |
| 5,804,507 A | 9/1998 | Perlov et al. | |
| 5,807,165 A | 9/1998 | Uzoh et al. | |
| 5,846,862 A | 12/1998 | May et al. | |
| 5,846,882 A | 12/1998 | Birang | |
| 5,871,392 A | 2/1999 | Meikle et al. | |
| 5,880,003 A | 3/1999 | Hayashi | |
| 5,886,031 A | 3/1999 | Carprio et al. | |
| 5,893,796 A | 4/1999 | Birang et al. | |
| 5,897,375 A | 4/1999 | Watts et al. | |
| 5,911,619 A | 6/1999 | Uzoh et al. | |
| 5,938,801 A | 8/1999 | Robinson | |
| 5,954,997 A | 9/1999 | Kaufman et al. | |
| 6,001,008 A | 12/1999 | Fujimori et al. | |
| 6,001,730 A | 12/1999 | Farkas et al. | |
| 6,004,880 A | 12/1999 | Liu et al. | |
| 6,010,964 A | 1/2000 | Glass | |
| 6,017,265 A | 1/2000 | Cook et al. | |
| 6,020,264 A | 2/2000 | Lustig et al. | |
| 6,024,630 A | 2/2000 | Shendon et al. | |
| 6,033,293 A | 3/2000 | Crevasse et al. | |
| 6,056,851 A | 5/2000 | Hsieh et al. | |
| 6,056,864 A | 5/2000 | Cheung | |
| 6,063,306 A | 5/2000 | Kaufmann et al. | |
| 6,066,030 A | 5/2000 | Uzoh | |
| 6,077,412 A | 6/2000 | Ting et al. | |
| 6,083,840 A | 7/2000 | Mravic et al. | |
| 6,090,239 A | 7/2000 | Liu et al. | |
| 6,096,652 A | 8/2000 | Watts et al. | |
| 6,103,096 A | 8/2000 | Datta et al. | |
| 6,106,728 A | 9/2000 | Kondo et al. | |
| 6,116,998 A | 9/2000 | Damgaard et al. | |
| 6,117,775 A | 9/2000 | Kondo et al. | |
| 6,117,783 A | 9/2000 | Kondo et al. | |
| 6,117,853 A | 9/2000 | Sakai et al. | |
| 6,126,853 A | 10/2000 | Kaufman et al. | |
| 6,143,155 A | 11/2000 | Adams et al. | |
| 6,143,656 A | 11/2000 | Yang et al. | |
| 6,153,043 A | 11/2000 | Edelstein et al. | |
| 6,156,124 A | 12/2000 | Tobin | |
| 6,159,079 A | 12/2000 | Zuniga et al. | |
| 6,171,352 B1 | 1/2001 | Lee et al. | |
| 6,171,467 B1 | 1/2001 | Weihs et al. | |
| 6,176,992 B1 | 1/2001 | Talieh | |
| 6,177,026 B1 | 1/2001 | Wang et al. | |
| 6,190,237 B1 | 2/2001 | Huyng et al. | |
| 6,194,317 B1 | 2/2001 | Kaisaki et al. | |
| 6,206,756 B1 | 3/2001 | Chopra et al. | |
| 6,210,257 B1 | 4/2001 | Carlson | |
| 6,210,555 B1 * | 4/2001 | Taylor et al. | 205/103 |
| 6,217,416 B1 | 4/2001 | Kaufman et al. | |
| 6,218,305 B1 | 4/2001 | Hosali et al. | |
| 6,234,870 B1 | 5/2001 | Uzoh et al. | |
| 6,238,271 B1 | 5/2001 | Cesna | |
| 6,238,592 B1 | 5/2001 | Wang | |
| 6,244,935 B1 | 6/2001 | Birang et al. | |
| 6,248,222 B1 | 6/2001 | Wang | |
| 6,251,235 B1 | 6/2001 | Talieh et al. | |
| 6,258,711 B1 | 7/2001 | Laursen | |
| 6,258,721 B1 | 7/2001 | Li et al. | |
| 6,261,168 B1 | 7/2001 | Jensen et al. | |
| 6,261,959 B1 | 7/2001 | Travis et al. | |
| 6,273,786 B1 | 8/2001 | Chopra et al. | |
| 6,273,798 B1 | 8/2001 | Berman | |
| 6,276,996 B1 | 8/2001 | Chopra | |
| 6,297,159 B1 | 10/2001 | Paton | |
| 6,303,049 B1 | 10/2001 | Lee et al. | |
| 6,303,551 B1 | 10/2001 | Li et al. | |
| 6,310,019 B1 | 10/2001 | Kakizawa et al. | |
| 6,315,803 B1 | 11/2001 | Ina et al. | |
| 6,315,883 B1 | 11/2001 | Mayer et al. | |
| 6,328,335 B1 | 12/2001 | Pant et al. | |
| 6,328,872 B1 | 12/2001 | Newton et al. | |
| 6,331,135 B1 | 12/2001 | Sabde et al. | |
| 6,348,076 B1 | 2/2002 | Canaperi et al. | |
| 6,354,916 B1 | 3/2002 | Uzoh et al. | |
| 6,355,075 B1 | 3/2002 | Ina et al. | |
| 6,355,153 B1 | 3/2002 | Uzoh et al. | |
| 6,368,184 B1 | 4/2002 | Beckage | |
| 6,375,693 B1 | 4/2002 | Cote et al. | |
| 6,381,169 B1 | 4/2002 | Bocian et al. | |
| 6,386,956 B1 | 5/2002 | Sato | |
| 6,391,166 B1 | 5/2002 | Wang | |
| 6,395,152 B1 | 5/2002 | Wang | |
| 6,402,591 B1 | 6/2002 | Thornton | |
| 6,402,925 B2 | 6/2002 | Talieh | |
| 6,406,363 B1 | 6/2002 | Xu et al. | |
| 6,409,904 B1 | 6/2002 | Uzoh et al. | |
| 6,416,685 B1 | 7/2002 | Zhang et al. | |
| 6,419,554 B2 | 7/2002 | Chopra | |
| 6,428,394 B1 | 8/2002 | Mooring et al. | |
| 6,428,721 B1 | 8/2002 | Ina et al. | |
| 6,429,133 B1 | 8/2002 | Chopra | |
| 6,440,186 B1 | 8/2002 | Sakai et al. | |
| 6,440,295 B1 | 8/2002 | Wang | |
| 6,447,371 B2 | 9/2002 | Brusic-Kaufman et al. | |
| 6,454,819 B1 | 9/2002 | Yano et al. | |
| 6,455,479 B1 | 9/2002 | Sahbari | |
| 6,471,847 B2 | 10/2002 | Talieh et al. | |
| 6,475,332 B1 | 11/2002 | Boyd et al. | |
| 6,482,307 B2 | 11/2002 | Ashjagee et al. | |
| 6,497,800 B1 | 12/2002 | Talieh et al. | |
| 6,508,952 B1 | 1/2003 | Lee et al. | |
| 6,517,426 B2 | 2/2003 | Lee | |
| 6,520,843 B1 | 2/2003 | Halley | |
| 6,551,179 B1 | 4/2003 | Halley | |
| 6,551,935 B1 | 4/2003 | Sinha et al. | |
| 6,555,158 B1 | 4/2003 | Yoshio et al. | |
| 6,561,889 B1 | 5/2003 | Xu et al. | |
| 6,562,719 B2 | 5/2003 | Kondo et al. | |
| 6,565,619 B1 | 5/2003 | Asano et al. | |
| 6,569,004 B1 | 5/2003 | Pham | |
| 6,572,463 B1 | 6/2003 | Xu et al. | |

| | | | |
|---|---|---|---|
| 6,585,579 B2 | 7/2003 | Jensen et al. | |
| 6,593,239 B2 | 7/2003 | Kaufman et al. | |
| 6,596,638 B1 | 7/2003 | Kondo et al. | |
| 6,602,112 B2 | 8/2003 | Tran et al. | |
| 6,605,537 B2 | 8/2003 | Brian et al. | |
| 6,616,976 B2 | 9/2003 | Montano et al. | |
| 6,620,215 B2 | 9/2003 | Li et al. | |
| 6,630,059 B1 | 10/2003 | Uzoh et al. | |
| 6,676,484 B2 | 1/2004 | Chopra | |
| 6,679,928 B2 | 1/2004 | Costas et al. | |
| 6,679,929 B2 | 1/2004 | Asano et al. | |
| 6,693,036 B1 | 2/2004 | Nogami et al. | |
| 6,723,219 B2 | 4/2004 | Collins | |
| 6,776,693 B2 | 8/2004 | Duboust et al. | |
| 6,811,680 B2 | 11/2004 | Chen et al. | |
| 6,837,983 B2 | 1/2005 | Duboust et al. | |
| 2001/0005667 A1 | 6/2001 | Tolles et al. | |
| 2001/0024878 A1 | 9/2001 | Nakamura | |
| 2001/0035354 A1 | 11/2001 | Ashjaee et al. | |
| 2001/0036746 A1 | 11/2001 | Sato et al. | |
| 2001/0040100 A1 | 11/2001 | Wang | |
| 2001/0042690 A1 | 11/2001 | Talieh et al. | |
| 2002/0008036 A1 | 1/2002 | Wang | |
| 2002/0011417 A1 | 1/2002 | Talieh et al. | |
| 2002/0020621 A1 | 2/2002 | Uzoh et al. | |
| 2002/0040100 A1 | 4/2002 | Kume et al. | |
| 2002/0070126 A1 | 6/2002 | Sato et al. | |
| 2002/0072309 A1 | 6/2002 | Sato et al. | |
| 2002/0074230 A1 | 6/2002 | Sato et al. | |
| 2002/0077037 A1 | 6/2002 | Tietz | |
| 2002/0088709 A1 | 7/2002 | Hongo et al. | |
| 2002/0088715 A1 | 7/2002 | Talieh et al. | |
| 2002/0096659 A1 | 7/2002 | Sakai et al. | |
| 2002/0108861 A1 | 8/2002 | Emesh et al. | |
| 2002/0119286 A1 | 8/2002 | Chen et al. | |
| 2002/0130634 A1 | 9/2002 | Ziemkowski et al. | |
| 2002/0139055 A1 | 10/2002 | Asano et al. | |
| 2002/0160698 A1 | 10/2002 | Sato | |
| 2003/0029731 A1 | 2/2003 | Ashjaee et al. | |
| 2003/0038038 A1 | 2/2003 | Basol et al. | |
| 2003/0073386 A1 | 4/2003 | Ma et al. | |
| 2003/0079416 A1 | 5/2003 | Ma et al. | |
| 2003/0083215 A1 | 5/2003 | Kakizawa et al. | |
| 2003/0104762 A1 | 6/2003 | Sato et al. | |
| 2003/0113996 A1 | 6/2003 | Nogami et al. | |
| 2003/0114004 A1 | 6/2003 | Sato et al. | |
| 2003/0116445 A1 | 6/2003 | Sun et al. | |
| 2003/0119311 A1 | 6/2003 | Basol et al. | |
| 2003/0136055 A1 | 7/2003 | Li et al. | |
| 2003/0153184 A1 | 8/2003 | Wang et al. | |
| 2003/0170091 A1 | 9/2003 | Shomler et al. | |

FOREIGN PATENT DOCUMENTS

| | | |
|---|---|---|
| EP | 0 325 753 | 8/1989 |
| EP | 0 455 455 | 11/1991 |
| EP | 0 527 537 | 2/1993 |
| EP | 0 811 665 | 12/1997 |
| EP | 0 846 742 | 6/1998 |
| EP | 1 103 346 | 5/2001 |
| EP | 1 170 761 | 1/2002 |
| EP | 1 368 826 | 12/2003 |
| JP | 11042554 | 2/1999 |
| JP | 2001-77117 | 3/2001 |
| JP | 2001-77117 | 2/2004 |
| SU | 1618538 | 1/1991 |
| WO | WO 98/04646 | 2/1998 |
| WO | WO 98/49723 | 11/1998 |
| WO | WO 99/41434 | 8/1999 |
| WO | WO 99/46081 | 9/1999 |
| WO | WO 99/53119 | 10/1999 |
| WO | WO 99/53532 | 10/1999 |
| WO | WO 99/65072 | 12/1999 |
| WO | WO 00/03426 | 1/2000 |
| WO | WO 00/55876 | 2/2000 |
| WO | WO 00/26443 | 5/2000 |
| WO | WO 00/33356 | 6/2000 |
| WO | WO 00/59682 | 10/2000 |
| WO | WO 00/77278 | 12/2000 |
| WO | WO 00/77278 A1 | 12/2000 |
| WO | WO 01/13416 | 2/2001 |
| WO | WO 01/13416 A1 | 2/2001 |
| WO | WO 01/32362 A1 | 5/2001 |
| WO | WO 01/49452 | 7/2001 |
| WO | WO 01/52307 | 7/2001 |
| WO | WO 01/63018 | 8/2001 |
| WO | WO 01/71066 | 9/2001 |
| WO | WO 01/88954 | 11/2001 |
| WO | WO 02/23616 | 3/2002 |
| WO | WO 02/064314 | 8/2002 |
| WO | WO 02/075804 | 9/2002 |
| WO | WO 02/88229 | 11/2002 |
| WO | WO 03/009361 A2 | 1/2003 |
| WO | WO 03/060962 | 7/2003 |

OTHER PUBLICATIONS

Nogami, "An Innovation to Integrate Porous Low-K Materials and Copper," *InterConnect Japan 2001*, Honeywell Seminar (Dec. 6, 2001) pp. 1-12.

Landolt, *"Fundamental Aspects of Electropolishing,"* Mar. 18, 1996 pp. 1-11.

Contolini, et al., "Electrochemical Planarization of ULSI Copper," *Solid State Technology*, Jun. 1997, pp. 155-160.

PCT Notification of Transmittal of the International Search Report of the Declaration; PCT/US01/46449 filed Mar. 12, 2001.

* cited by examiner

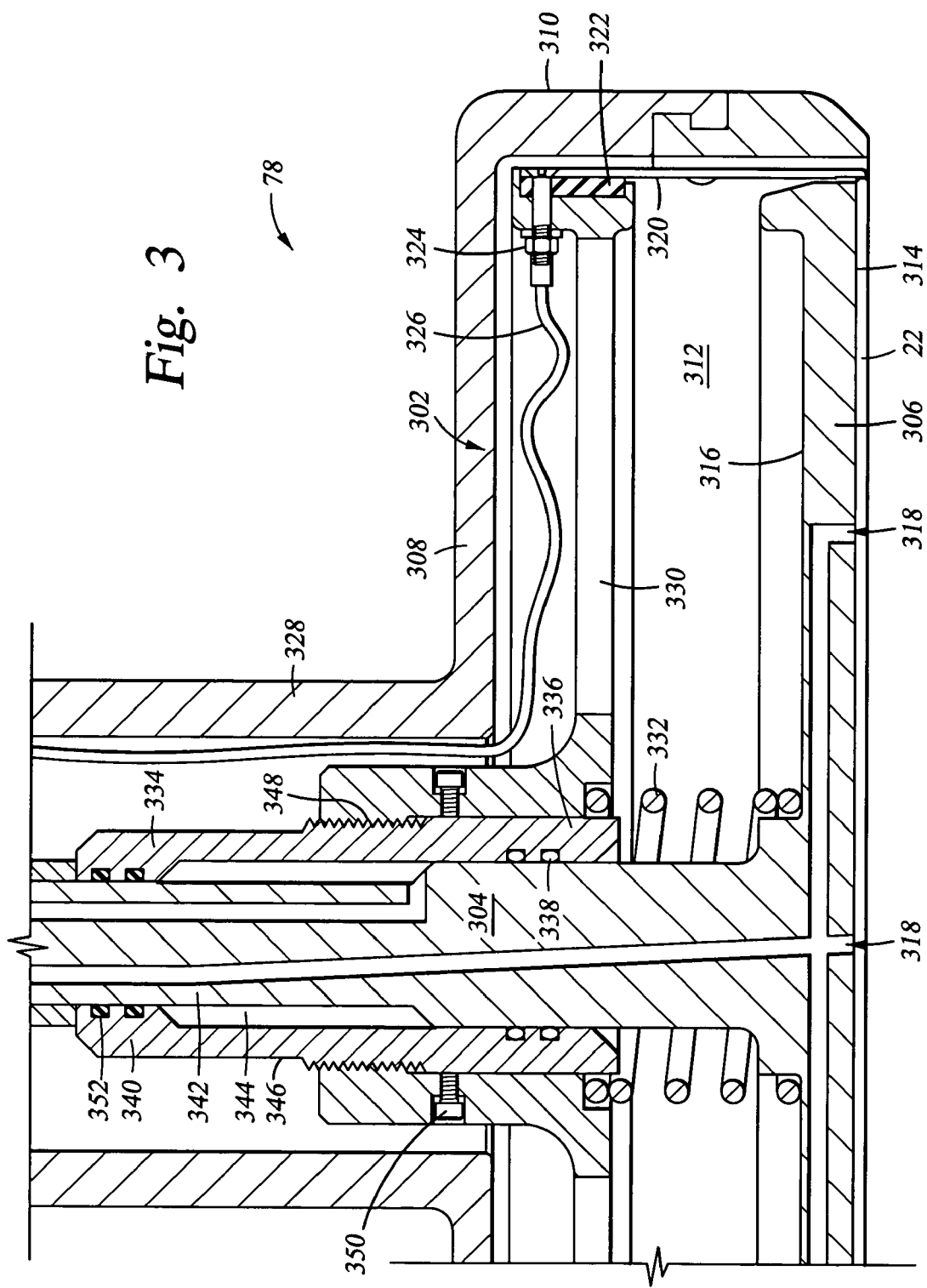

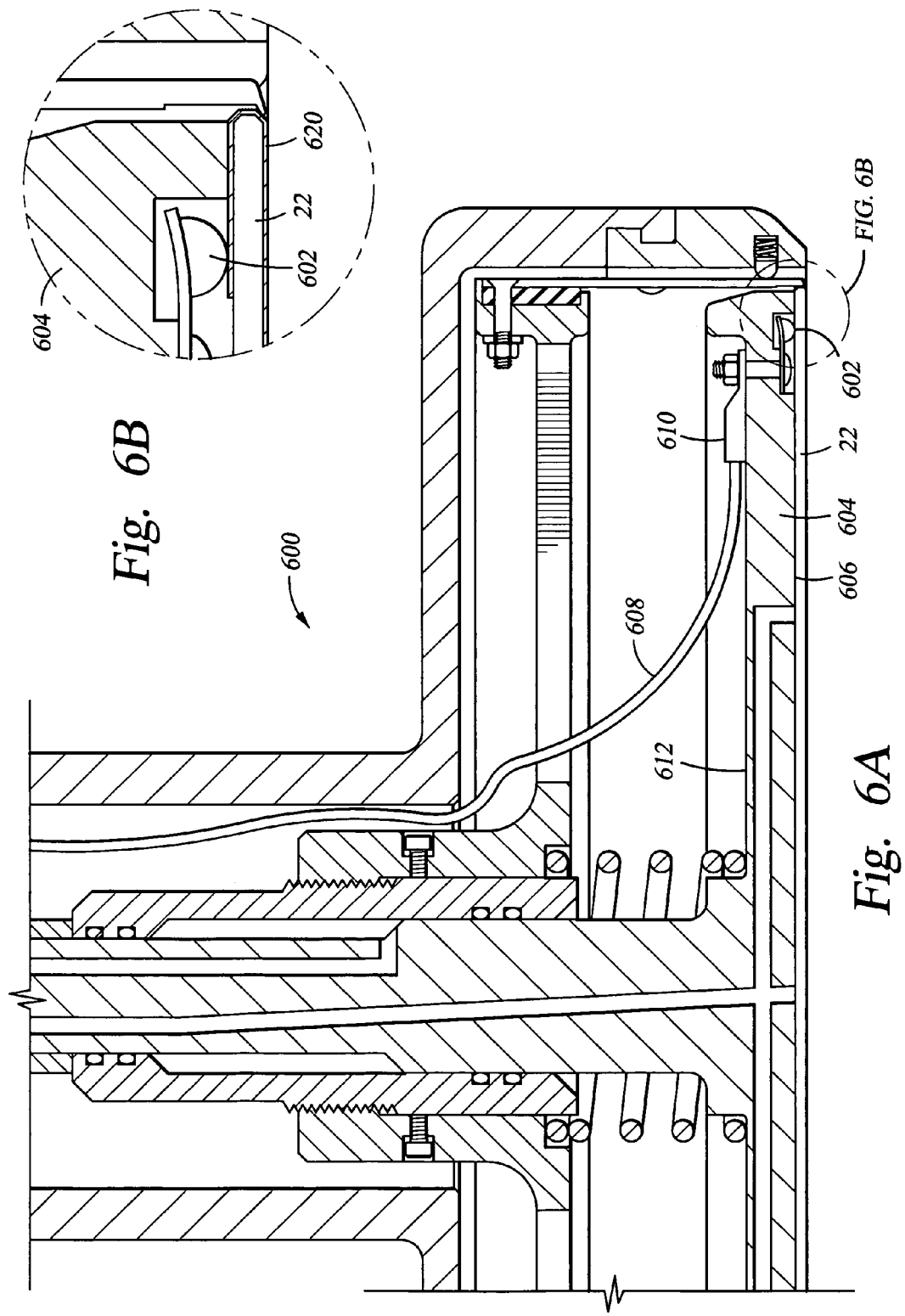

INTEGRATED MULTI-STEP GAP FILL AND ALL FEATURE PLANARIZATION FOR CONDUCTIVE MATERIALS

CROSS-REFERENCE TO RELATED APPLICATIONS

This application is a divisional of U.S. patent application Ser. No. 09/739,139, filed Dec. 18, 2000 now U.S. Pat. No. 6,896,776. The aforementioned related patent application is herein incorporated by reference.

BACKGROUND OF THE INVENTION

Field of the Invention

The present invention relates to an apparatus and method for deposition and planarization of a material, such as a metal, on a substrate.

Sub-quarter micron multi-level metallization is one of the key technologies for the next generation of ultra large scale integration (ULSI). The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die.

In the fabrication of integrated circuits and other electronic devices, multiple layers of conducting, semiconducting, and dielectric materials are deposited on or removed from a surface of a substrate. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and now electro-chemical plating (ECP).

As layers of materials are sequentially deposited and removed, the uppermost surface of the substrate may become non-planar across its surface and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide an even surface for subsequent levels of metallization and processing.

Chemical mechanical planarization, or chemical mechanical polishing (CMP), is a common technique used to planarize substrates. CMP utilizes a chemical composition, typically a slurry or other fluid medium, for selective removal of material from substrates. In conventional CMP techniques, a substrate carrier or polishing head is mounted on a carrier assembly and positioned in contact with a polishing pad in a CMP apparatus. The carrier assembly provides a controllable pressure to the substrate urging the substrate against the polishing pad. The pad is moved relative to the substrate by an external driving force. The CMP apparatus effects polishing or rubbing movement between the surface of the substrate and the polishing pad while dispersing a polishing composition, or slurry, to effect chemical activity and/or mechanical activity and consequential removal of material from the surface of the substrate.

Copper is becoming a metal of choice in ULSI to form the interconnects that provide the conductive pathway in integrated circuits and other electronic devices. Copper is a material having advantageous properties such as lower resistance and better electromigration performance compared to traditional materials such as aluminum. Copper can be deposited by various techniques such as PVD, CVD and electroplating. Electroplating (ECP) is seen as a low cost and effective deposition technique with promise. ECP is performed by introducing a substrate into a plating bath and applying a current to the substrate. The copper ions plate out of solution and deposit onto the substrate.

However, copper is difficult to pattern and etch. Accordingly, copper features are formed using damascene or dual damascene processes. In damascene processes, a feature is defined in a dielectric material and subsequently filled with copper. A barrier layer is deposited conformally on the surfaces of the features formed in the dielectric layer prior to deposition of the copper. Copper is then deposited over the barrier layer and the surrounding field. The copper deposited on the field is removed by CMP processes to leave the copper filled feature formed in the dielectric material. Both abrasive and abrasive free CMP processes are available and others are being developed to remove copper. Abrasives refer to additives in the slurry or formed in a polishing pad which provide mechanical abrasion of a surface being polished. One example of an abrasive is silica particles in a polishing slurry.

FIG. 1 illustrates the step height of deposited materials, such as copper, over various features formed on a substrate surface. For features smaller than 1 μm, the surface of the deposited copper over the feature is higher than on the field; however, for features larger than 1 μm, the field surface is higher. To achieve complete planarization over wide features, it is necessary to deposit a copper thickness ~1.4-1.6 times that of the intra-level dielectric (ILD) thickness. For typical power lead levels, a 2.0 μm thick copper layer is required. However, the deposition of this thick copper layer will limit the throughout of CMP.

Another problem with CMP of copper is the tendency of copper surfaces to dish as a result of polishing. Dishing can result from copper over-polish used to clear all copper formed on the field across the whole wafer. One area where dishing may occur is in areas where conductive features exceed five (5) microns. This is particularly problematic in some current designs where the conductive features are often greater than about ten (10) microns. To prevent excessive dishing in these surfaces during CMP processing, oxide pillars are typically interposed in these features to reduce the width of the conductive feature exposed to CMP processing.

As a result, there is a need for an apparatus and method for depositing and planarizing a metal layer, such as a copper layer, on a substrate.

SUMMARY OF THE INVENTION

The present invention generally provides method and apparatus for depositing and planarizing a layer on a substrate using electrochemical deposition techniques and polishing techniques.

In one aspect, the invention provides an apparatus for depositing and planarizing a material on a substrate, comprising a partial enclosure defining a processing region and having a fluid inlet and a fluid outlet, a shaft connected to the partial enclosure on one end and to an actuator on an opposing end thereof and adapted to rotate the partial enclosure, a permeable disc disposed in the partial enclosure, a diffuser plate disposed in the partial enclosure and positioned below the permeable disc, and a substrate carrier movably disposed above the permeable disc, the substrate carrier having a substrate mounting surface and a plurality of electrical contacts disposed about the perimeter of the substrate receiving surface.

In another aspect, the invention a processing system for forming a planarized layer on a substrate, comprising a processing platform having two or more processing stations, a loading station and a substrate carrier carousel disposed above the processing stations and the loading station and a processing apparatus positioned at each processing station, the processing apparatus comprising a partial enclosure defining a processing region and having a fluid inlet and a fluid outlet, a shaft connected to the partial enclosure on one end and to an actuator on an opposing end thereof and adapted to rotate the partial enclosure, a permeable disc disposed in the partial enclosure, a diffuser plate disposed in the partial enclosure and positioned below the permeable disc, and a substrate carrier movably disposed above the permeable disc, the substrate carrier having a substrate mounting surface and a plurality of electrical contacts disposed about the perimeter of the substrate receiving surface.

In another aspect, the invention provides a method of processing a substrate, comprising, positioning the substrate in an electrolyte solution a first distance from a permeable disc disposed in the electrolyte, applying a current to a surface of the substrate exposed to the electrolyte and depositing a material on the substrate, positioning the substrate a second distance from the permeable disc, the second distance being less than the first distance, and depositing the material on the substrate at the second distance.

In another aspect, the invention provides a method of processing a substrate, comprising positioning the substrate in an electrolyte solution a first distance from a permeable disc disposed in the electrolyte and applying a current to a surface of the substrate exposed to the electrolyte and depositing a material on the substrate.

In another aspect, the invention provides a method of processing a substrate, comprising positioning the substrate in an electrolyte solution a first distance from a permeable disc disposed in the electrolyte and depositing a material on the substrate by an electroless deposition technique, positioning the substrate a second distance from the permeable disc, the second distance being less than the first distance, and depositing the material on the substrate at the second distance by an electroless deposition technique.

In another aspect of the invention a method is provided for processing a substrate surface, comprising providing a substrate comprising a dielectric layer with feature definitions formed therein, a barrier layer conformally deposited on the dielectric layer and in the feature definitions formed therein, depositing a copper containing material on the barrier layer while planarizing the copper containing material formed thereon, polishing the substrate surface on a first platen to remove residual copper containing materials, polishing the substrate surface on a second platen to remove the barrier layer, and buffing the substrate surface on a third platen to remove defects formed thereon.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 3 is a partial cross sectional view of one embodiment of a carrier head assembly.

FIG. 6A depicts a partial view of another embodiment of a carrier head assembly.

FIG. 6B is an enlarged detail view of a contact plate.

DETAILED DESCRIPTION OF THE PREFERRED EMBODIMENT

Figure 1:
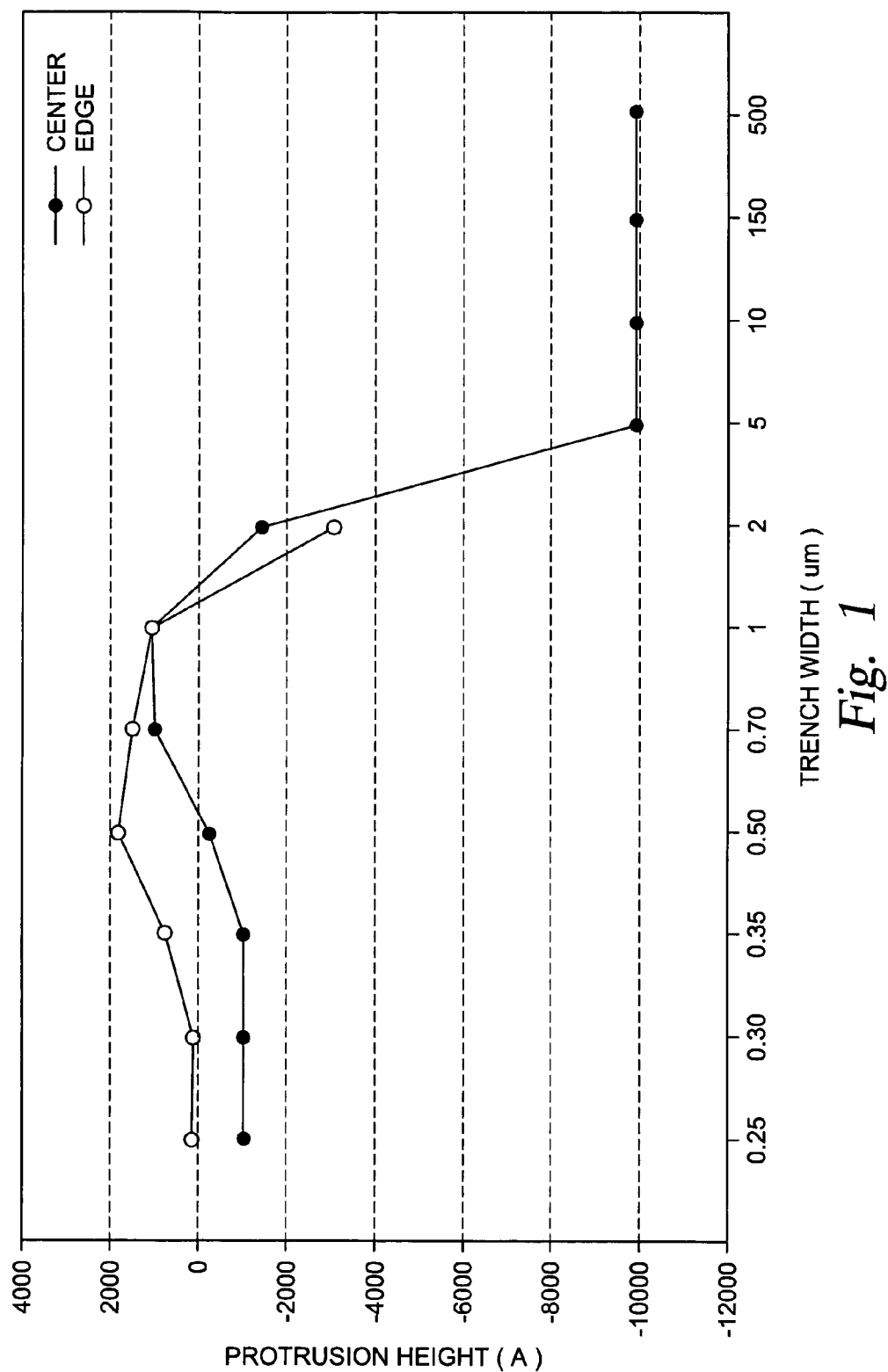
FIG. 1 is a plot showing step height of a deposited material over various features formed in a substrate surface.
Figure 2:
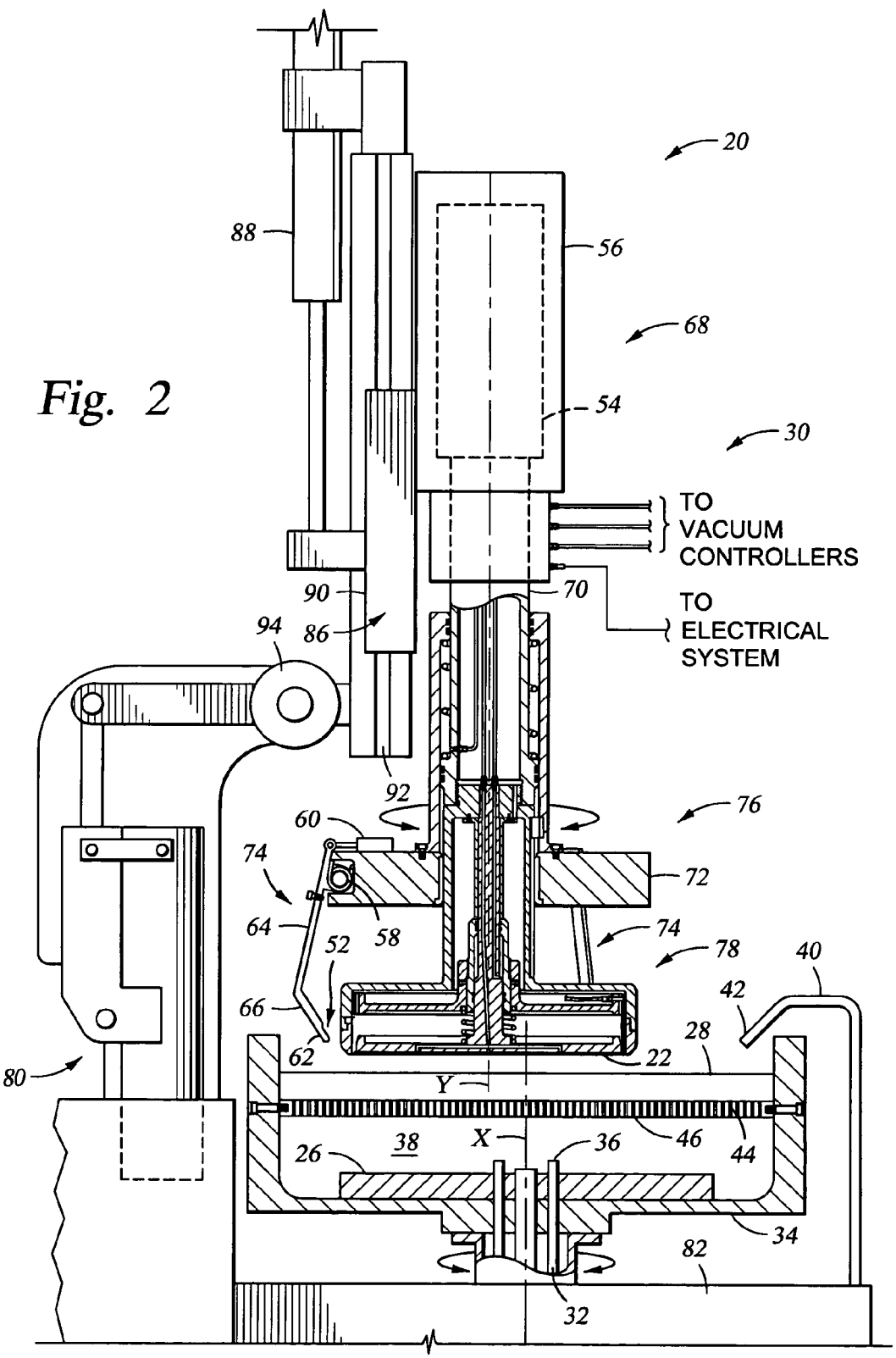
FIG. 2 is a cross sectional view of one embodiment of a processing apparatus of the invention showing a substrate disposed above a permeable disc.

FIG. 2 is a cross sectional view of one embodiment of an apparatus 20 for depositing and planarizing a metal layer on a substrate 22. One example of an apparatus that may be adapted to benefit from the invention is an ELECTRA™ electroplating tool, available from Applied Materials, Inc., of Santa Clara, Calif. An example of a suitable electroplating tool is described by Dordi, et al. in U.S. patent application Ser. No. 09/289,074, U.S. Pat. No. 6,258,220, filed on Apr. 8, 1999, assigned to common assignee Applied Materials, Inc., and which is incorporated by reference herein to the extent not inconsistent with the invention. The apparatus 20 generally includes a carrier head assembly 30 movably supported by a stanchion 80 over a partial enclosure 34. The stanchion 80 and enclosure 34 are generally disposed on a common base 82. The stanchion 80 generally includes a base support 84 and a lift mechanism 86. The base support 84 extends perpendicularly from the base 82 and may be rotatable on its axis so that the carrier assembly 30 may be moved over the partial enclosure 34 or to other positions, for example, to other enclosures or to interface with other processing systems not shown.

The lift mechanism 86 is coupled to the carrier assembly 30. The lift mechanism 86 generally controls the elevation of the carrier assembly 30 in relation to the partial enclosure 34. The lift mechanism 86 includes be a linear actuator 88, such as a ball screw, lead screw, pneumatic cylinder and the like, and a guide 90 that slides along a rail 92. The rail 92 is coupled to the base support 84 by a hinge 94 so that the rail 92 of the lift mechanism 86 (i.e., direction of motion) may be controllably orientated through a range of angles between about 90 to about 60 degrees relative to horizontal. The lift mechanism 86 and hinge 94 allows the carrier assembly 30 holding a substrate 22 to be lowered into the partial enclosure 34 in various orientations. For example, to minimize the formation of bubbles upon the substrate 22 when interfacing with fluids disposed within the enclosure 34, the substrate 22 may be orientated at an angle during entry into the partial enclosure 34 and then rotated to a horizontal orientation once therein.

The partial enclosure 34 generally defines a container or electrolyte cell in which an electrolyte or other polishing/deposition fluid can be confined. The electrolyte used in processing the substrate 22 can include metals such as copper, aluminum, tungsten, gold, silver or other materials which can be electrochemically deposited onto a substrate. As one example, copper sulfate ($CuSO_4$) can be used as the electrolyte. Copper containing solutions used for plating are available from Shipley Ronel, a division of Rohm and Haas, headquartered in Philadelphia, Pa., under the tradename Ultrafill 2000.

The enclosure 34 typically includes an anode 26, a diffuser plate 44 and a permeable disc 28 disposed therein. A permeable disc 28, such as a polishing pad, is disposed and supported in the electrolyte cell on the diffuser plate 44. The partial enclosure 34 can be a bowl shaped member made of a plastic such as fluoropolymers, TEFLON®, PFA, PE, PES, or other materials that are compatible with plating chemistries. The partial enclosure 34 is connected to a shaft 32 on its lower surface that extends below the base 82. Alternatively, the partial enclosure 34 can be connected to a mounting platform that is connected to the shaft 32. The shaft 32 is connected to an actuator (not shown), such as a motor, e.g., a stepper motor, disposed in the base 82. The actuator is adapted to rotate the partial enclosure 34 about vertical axis x. In one embodiment, the shaft 32 defines a central passage through which fluid is delivered into the partial enclosure 34 through a plurality of ports 36 formed in the shaft 32.

The anode 26 is positioned at the lower portion of the enclosure 34 where it may be immersed in the electrolyte solution. Anode 26 can be a plate-like member, a plate having multiple holes formed therethrough or a plurality of anode pieces disposed in a permeable membrane or container. The anode 26 is preferably comprised of the material to be deposited, such as copper, nickel, aluminum, gold, silver, tungsten and other materials which can be electrochemically deposited on a substrate. In at least one embodiment, the anode 26 comprises a consumable anode which may require periodic replacement. Alternatively, the anode may comprise non-consumable anode of a material other than the deposited material, such as platinum for a copper deposition.

In at least one embodiment, the anode 26 is ring-shaped defining a central opening through which the fluid inlet of the shaft 32 is disposed. In embodiments where the anode 26 is plate-like, a plurality of holes may be formed through the anode to allow passage of electrolyte fluid therethrough. The anode 26 can alternatively be a ring anode, a plate anode, or a chamber confining plating material, including a permeable chamber or other enclosure.

The permeable disc 28 can be a polishing pad or other type of volume spacer which is compatible with the fluid environment and the processing specifications. The permeable disc 28 is positioned at an upper end of the partial enclosure 34 and supported on its lower surface by the diffuser plate 44. The permeable disc 28 is preferably conductive to ions in the electrolyte, and as such does not have to be permeable to metal ions, such as copper ions, for example, in copper applications. The metal ions can be supplied from a fluid delivery line 40 having an outlet 42 positioned above the permeable disc 28. The permeable disk 28 may disposed adjacent to or in contact with the anode 26.

The permeable disk 28 may comprise a plurality of pores of a sufficient size and organization to allow the flow of electrolyte to the substrate surface while preventing the flow of deposition by-products, such as accelerator and suppressor degradation by-products. The permeable disk 28 may also comprise grooves formed therein to assist transport of fresh electrolyte from the bulk solution into enclosure 34 to the gap between the substrate 22 and the permeable disk 28. However, the permeable disc 28 can be permeable to metal ions in some applications. Typically, the permeable disc 28 may be a polishing pad comprised of polymeric materials, such as polyurethane. Examples of polishing pads which can be used include, but are not limited to, an IC 1000, an IC 1010, a Suba series pad, a Politex series pad, a MH S series pad from Rodel, Inc., of Phoenix, Ariz., or a PVDF pad from Asahi of Japan, or a fixed abrasive pad from 3M, of Minneapolis, Minn.

The diffuser plate 44 provides support for the permeable disc 28 in the partial enclosure 34. The diffuser plate 44 can be secured in the partial enclosure 34 using fasteners such as screws 38 or other means such as snap or interference fit with the enclosure, being suspended therein and the like. The diffuser plate 44 can be made of a material such as a plastic, e.g., fluoropolymer, PE, TEFLON®, PFA, PES, HDPE, UHMW or the like. The diffuser plate 44, in at least one embodiment, includes a plurality of holes or channels 46 formed therein. The holes 46 are sized to enable fluid flow therethrough and to provide uniform distribution of electrolyte through the permeable disc 28 to the substrate 22. The permeable disc 28 can be fastened to the diffuser plate 44 using adhesives that are compatible with the fluid environment and the processing requirements. The diffuser plate 44 is preferably spaced from the anode 26 to provide a wider process window, thus reducing the sensitivity of plating film thickness to the anode dimensions, and to separate the accelerator and suppressor decomposition by-products, for example, a mono-sulfide compound degraded from an accelerator, such as bis(3-sulfopropyl) disulfide, $C_6H_{12}Na_2O_6S_4$, commercially available from the Raschig Corp. of Germany, from a main plating volume 38 as shown in FIG. 2.

While not shown, a membrane may be disposed between the anode 26 and the permeable disc 28 to contain particles produced from the anode film from entering the enclosure 34 and depositing as particles on the substrate surface. For example, the membrane is permeable to electrolyte flow, but is not typically permeable to accelerator and suppressor degradation by-products on the anode surface.

The substrate carrier or head assembly 30 is movably positioned above the permeable disc 28. The substrate carrier assembly 30 is vertically movable above the permeable disc 28 and is laterally movable thereto, for example, the carrier assembly 30 may be rotatable about a vertical axis y. The x and y axis of the partial enclosure and the head assembly, respectively, are offset to provide orbital motion between the permeable disc 28 and the substrate carrier assembly 30. Orbital motion is broadly described herein as an elliptical relative motion between the permeable disc 28 and the substrate carrier assembly 30. The substrate carrier assembly 30 holds a substrate 22 with the deposition surface facing down towards the permeable disc 28. Alternatively, the permeable disk 28 may comprise a surface which may move in a translational or linear relative motion as well as rotatable, or circular rotational, relative motion to the substrate carrier assembly 30.

The substrate carrier assembly 30 generally includes a drive system 68, a head assembly 78 and a seat assembly 76. The drive system 68 is generally coupled to the guide 90 of the stanchion 80. The drive system 68 comprises a column 70 that extends from a power head 56 to support the seat assembly 76. The power head 56, which may be an electric or pneumatic motor, generally provides rotation to the column 70 along a central axis. The drive system 68 additionally includes an actuator 54 that is disposed within the column 70 and is coupled to the head assembly 78. The actuator 54, which may be a lead screw, pneumatic cylinder or other linear actuator, allows the head assembly 78 to move in relation to the seat assembly 76.

The seat assembly 76 generally includes a plurality of gripper fingers 74 disposed in a polar array about a gripper plate 72. The gripper plate 72 is coupled to the column 70 so that the gripper plate 72 moves with the drive system 68. In one embodiment, three gripper fingers 74 are provided. The gripper fingers 74 generally include a base member 66, an extension 64 and a contact finger 62. The contact fingers 62 are disposed at an angle to the extension 64. The extension 64 is coupled to the base member 66. The base member 66 is rotatably coupled to the gripper plate 72. The base member 66 generally includes an aperture that aligns with a hole in the gripper plate 72. A clevis pin or other shaft member is disposed through the hole and aperture to allow rotation of the gripper finger 74 in relation to the gripper plate 72. An actuator 60 is coupled between the extension 64 and the gripper plate 72. The actuator 60 moves the gripper finger 74 between an open and closed position. A spring 58 may be optionally disposed on the clevis pin to bias the gripper finger 74 towards one position. When the contact fingers 62 are moved inward, a notch 52 disposed at the ends of each contact finger 62 defines a seat 50 that is adapted to receive the substrate 22 from a transfer robot (not shown). In the inward position, the extensions 64 are disposed at a distance from each other that allows the substrate 22 and robot to pass therebetween (See FIG. 5A).

FIG. 3 depicts one embodiment of the head assembly 78. The head assembly 78 generally includes a housing 302, a stem 304, a support plate 306 and a plurality of substrate clamps 320 (one of the clamps 320 is shown). Generally, the housing 302 includes a hollow shaft 328 coupled to the actuator 54 at one end and terminating in a flange 308 at the opposite end. The flange 308 has a downwardly extending lip 310 that defines a central cavity 312.

The support plate 306 is disposed in the central cavity 312. The support plate 306 has a first side 314 and a second side 316. The substrate 22 is generally disposed proximate the first side 314 during processing. The first side 314 may additionally include one or more vacuum ports 318 disposed therein to restrain the substrate 22 proximate the first side 314.

The stem 304 is coupled to a second side 316 of the support plate 306. The stem 304 is generally orientated perpendicular to the support plate 306. The stem 304 may include passages disposed therein to provide vacuum or fluid to the first side 314 of the support plate 306 or other portions of the head assembly 78.

The substrate clamps 320 are generally comprised of a conductive material, such as copper. The substrate clamps 320 are coupled to a conductive ring 322 that electrically couples the individual substrate clamps 320. A screw typically fastens the substrate clamps 320 to the conductive ring 322 although other fasteners or fastening methods may be utilized. The conductive ring 322 generally includes a terminal 324 to allow the ring 322 to be electrically biased by a power source (not shown) coupled to the ring 322 by a lead 326 routed through the housing 302.

Figure 4A:
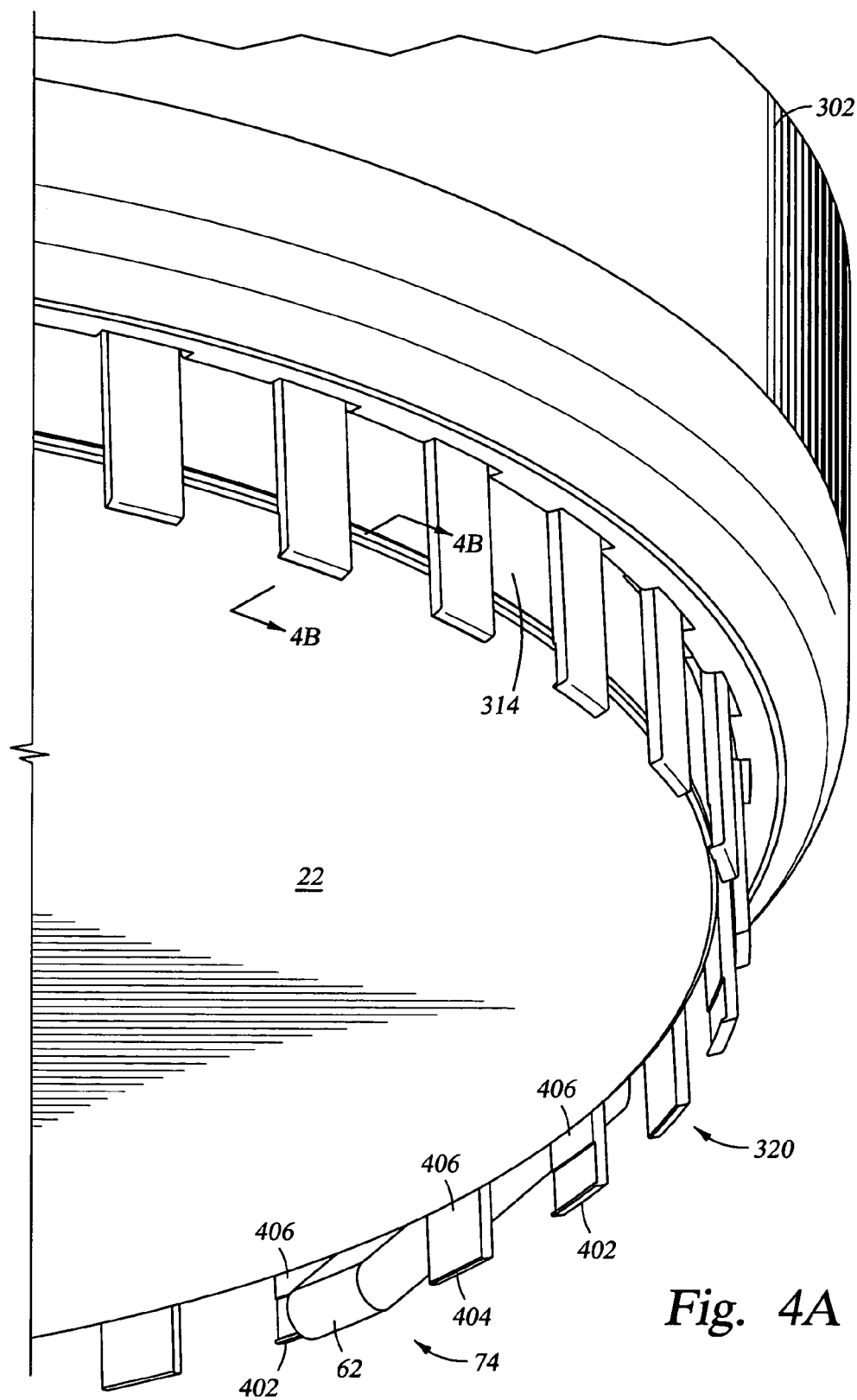
FIG. 4A is a partial perspective view of a plurality of substrate clamps.

FIG. 4A depicts a partial perspective view of the substrate clamps 320 extending from the first side 314 of the support plate 306. The substrate clamps 320 are generally disposed in a polar array at the perimeter of the support plate 306. In one embodiment, clamps 320 are movable relative to the support plate 306 such that a distance which the clamps 320 project from the support plate 306 may be controlled. Generally, the substrate clamps 320 comprise a plurality of first clamps 402 and a plurality of second clamps 404 spaced equally about the perimeter of the support plate 306. The first and second clamps 402, 404 generally alternate in sequence around the perimeter and are spaced to allow the gripper fingers 74 to pass therebetween. The first clamps 402 are generally rectangular in shape and may be optionally curved across their width to match the diameter of the substrate 22. The second clamps 404 are also generally rectangular in shape and may be optionally curved to match the diameter of the substrate 22. Both the first clamps and second clamps 402, 404 have an inner surface 406 that contacts the substrate.

Figures 4B, 4C:
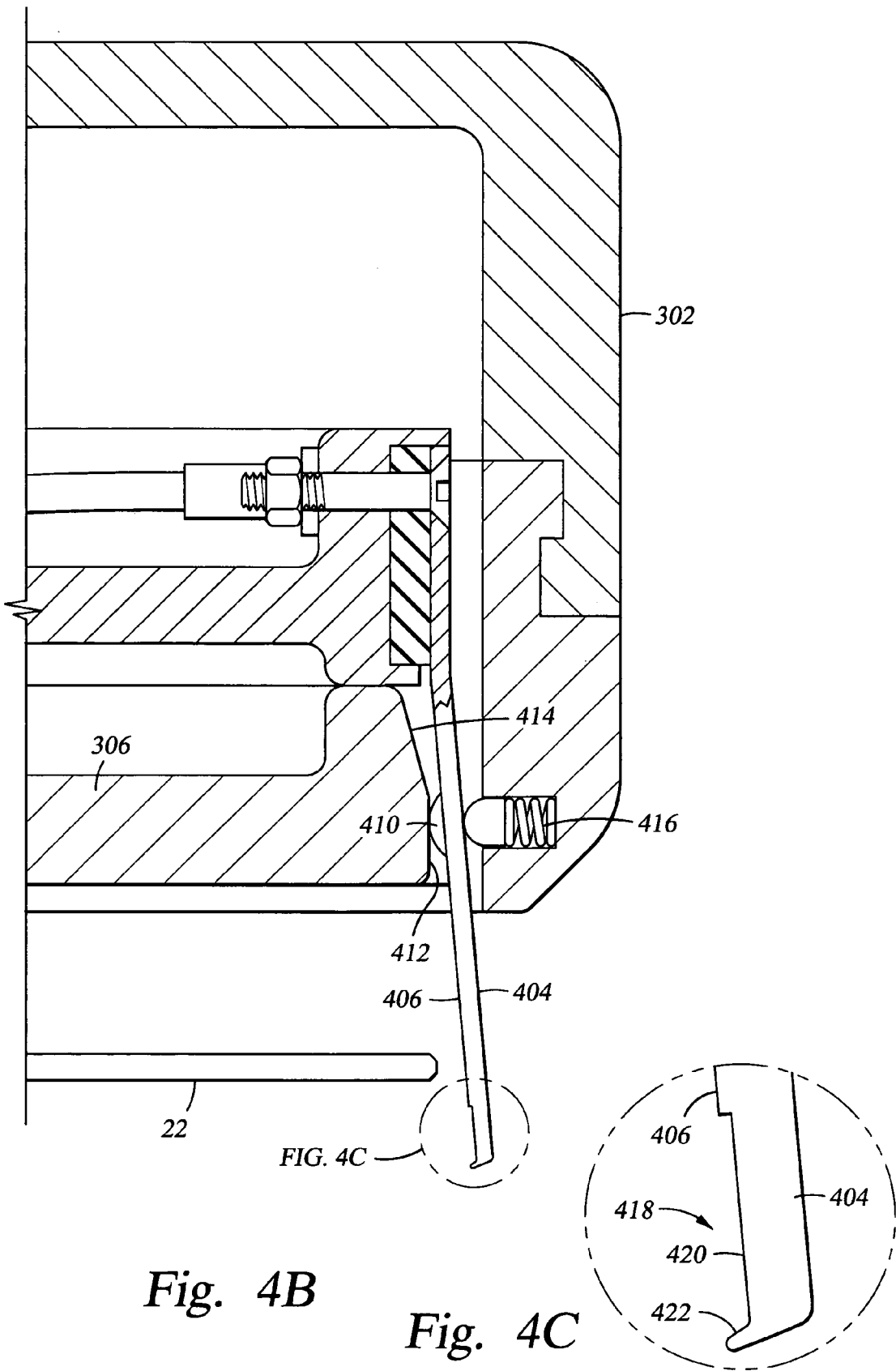
FIG. 4B is a sectional view of one of the substrate clamps taken along section line 4B-4B of FIG. 4A.
FIG. 4C is an enlarged detail view of the substrate clamp of FIG. 4B.

As illustrated in FIGS. 4A and 4B, the clamps 320 are angled outward to allow the substrate 22 to pass therebetween when extended. A bump 410 disposed on the inner surface of the clamp 320 interfaces with a peripheral surface 412 of the support plate 306. The bump 410 causes the clamp 320 to flare outwardly when the clamp 320 is extended. Optionally, support surface 306 may include a chamfer 414 to allow smooth movement of the bump 410 onto the surface 412 of the support plate 306. The housing 302 generally includes a biasing member disposed radially outward of the clamps 320 that urges the clamps 320 inward. In one embodiment, the biasing member is a détente pin 416.

Referring to FIG. 4C, the second clamp 404 generally includes a notch 418 formed on the contact surface near the tip. The notch 418 has a bottom surface 420 that is generally greater in length than the thickness of the substrate 22. A wall 422 of the notch 418 closest the end of the first clamp 404 is generally chamfered or angled to contact the bevel or rounded edge of the substrate 22.

Figure 5A:
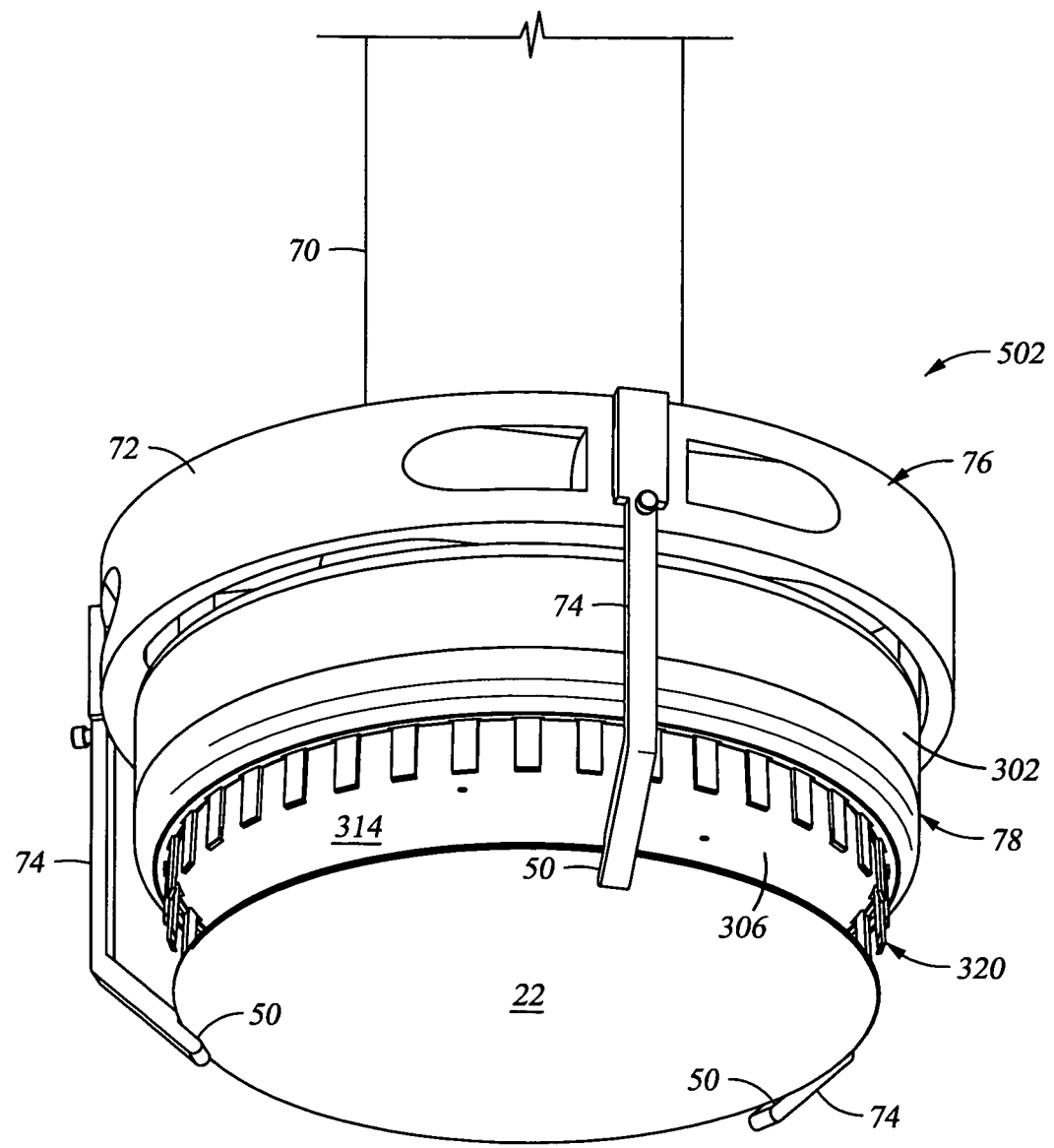
FIGS. 5A through 5D depict a substrate being secured to the carrier head assembly
Figure 5B:
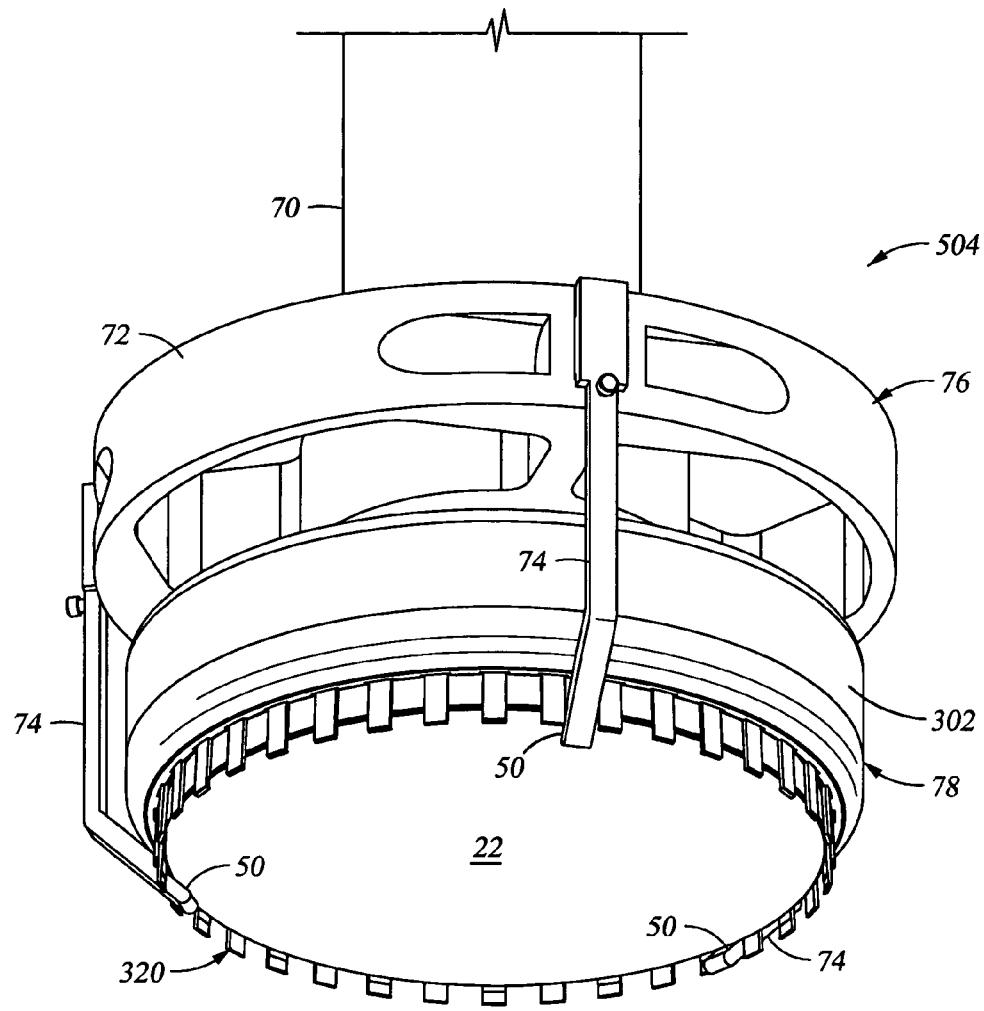
Figure 5D:
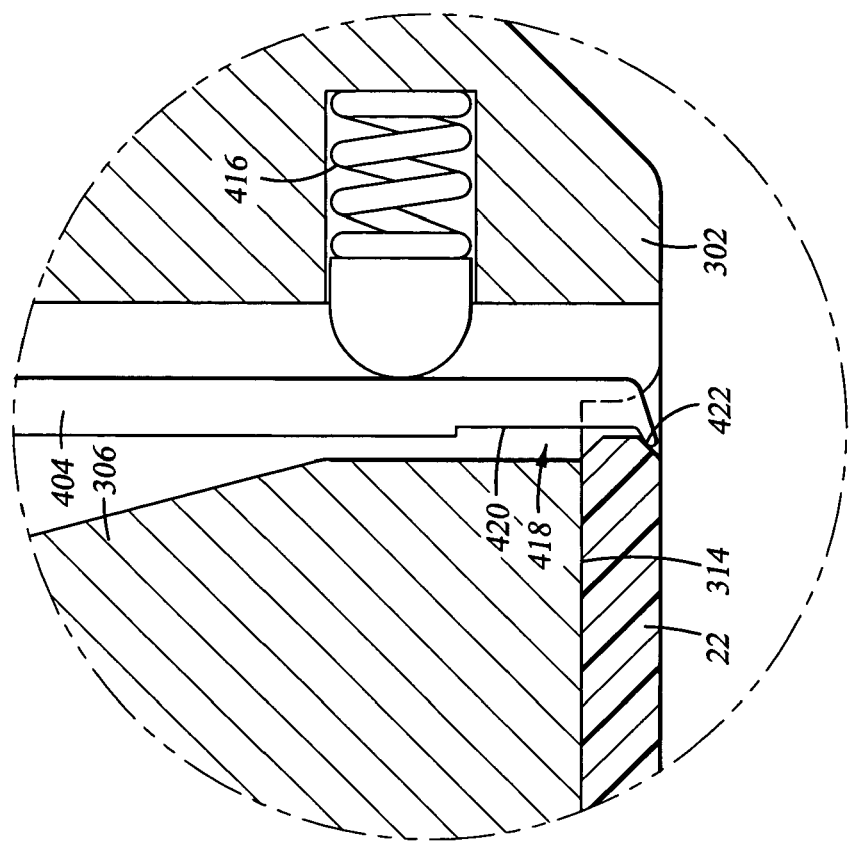
Figure 5C:
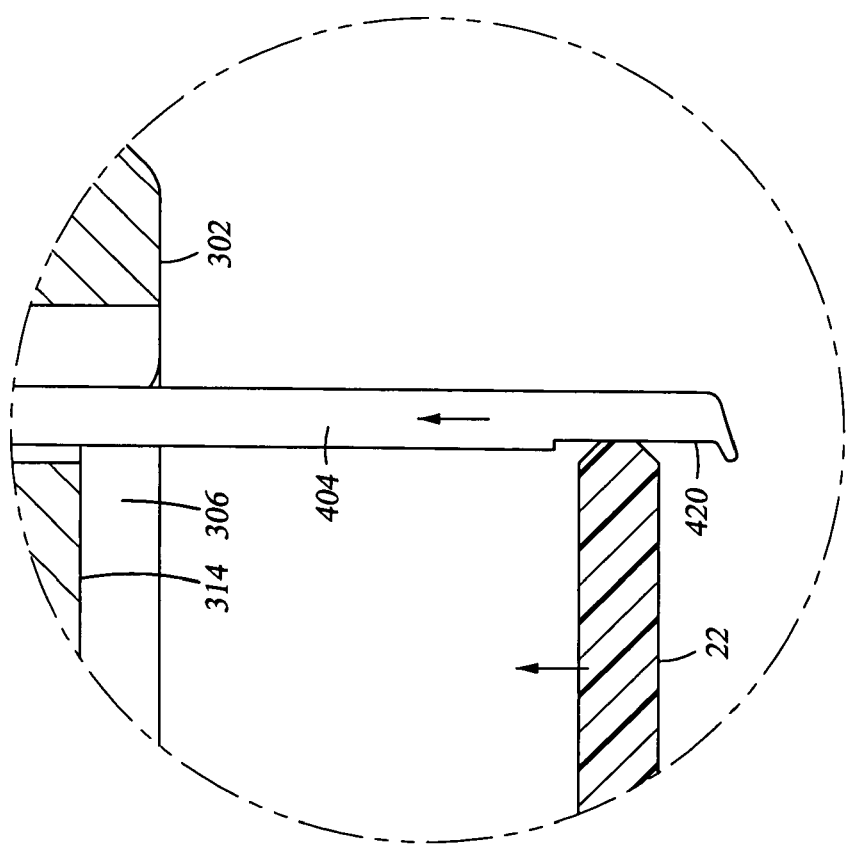

FIGS. 5A, 5B, 5C and 5D depict the substrate 22 being loaded into the carrier assembly 30. In FIG. 5A, the gripper fingers 74 are rotated to form the seat 50 that receives the substrate 22 from the robot not shown. The head assembly 78 is disposed in a first position 502 proximate the seat assembly 76. The substrate clamps 320 are fully extended from the first side 314 of the support plate 306. After the robot is removed leaving the substrate 22 in the seat 50 of the gripper finger 74, the head assembly 78 is then extended into a second position 504 to load the substrate 22 held in the seat 50 between the substrate clamps 320 (See FIG. 5B). The first clamps 402 center the substrate 22 relative to the head assembly 78. The clamps 320 are then retracted towards the support plate 306. The angled wall 422 of the second clamp 404 contacts the beveled edge of the substrate 22 and pulls the substrate 22 against the support plate 306. The interaction between the angled wall 422 and substrate 22 additionally causes the second clamp 404 to flex outwardly against the détente pin 416, displacing the bottom surface 420 of the notch 418 from the substrate perimeter. The flexed second clamp 404 and the detente pin 416 combine to urge the second clamp 404 inwardly to capture the substrate 22 against the support plate 306 while providing good electrical contact between the clamp 404 and substrate 22 (See FIGS. 5C and 5D).

Returning to FIG. 3, the conductive ring 322 is secured to a mounting plate 330 that is disposed in the central cavity 312 between the housing 302 and the support plate 306. The mounting plate 330 is generally movable relative to the support plate 306 so that the distance the substrate clamps 320 extend beyond the first side 314 of the support plate may be controlled. Generally, the mounting plate 330 is biased away from the support plate 306 by a spring 332 disposed therebetween.

To facilitate movement of the mounting plate 330 and substrate clamps 320, the mounting plate 330 is coupled to a sleeve 334 that is movably disposed around the stem 304. The sleeve 334 has a first diameter portion 336 that is sealed against the stem 304 at one end by a seal such as an o-ring 338. The sleeve 334 has a smaller, second diameter portion 340 that interfaces with a narrower portion 342 of the stem 304. The narrower portion 342 of the stem 304 is sealed to the sleeve 334 by an o-ring 352, thus creating a piston chamber 344 between the stem 304 and sleeve 334. As fluid, such as air, is applied or evacuated from the chamber 344, the resulting force applied between the sleeve 334 and stem 304 causes the sleeve 334 to move, thus correspondingly moving the substrate clamps 320. An outer portion 346 of the sleeve 334 is threaded and mates with a corresponding male threaded portion 348 disposed in the mounting plate 330. The amount of thread engagement between the mounting plate 330 and sleeve 334 may be adjusted to set the distance the substrate clamps 320 protrude from the support plate 306 at a predetermined amount. A set screw 350 in the mounting plate 330 may be tightened to prevent the mounting plate 330 from inadvertently turning about the sleeve 334.

FIG. 6A depicts a partial view of another embodiment of a substrate carrier assembly 600. The carrier assembly 600 is substantially similar to the carrier assembly 30 described above except wherein a contact plate 602 is disposed on a support plate 604. Generally, the contact plate 602 is disposed on a first side 606 of the support plate 604. The contact plate 602 is comprised of a conductive material and is utilized to bias the substrate 22 during processing. The contact plate 602 is electrically coupled to a terminal 610 disposed on a second side 612 of the support plate 604. The terminal 610 facilitates coupling the contact plate 602 to a power source (not shown) by a lead 608 that is used to bias the substrate 22.

Referring to FIG. 6B, the contact plate 602 is generally located proximate the edge of the substrate 22. The contact plate 602 couples the charge to the substrate 22 directly or to a conductive seed layer 620 disposed on the substrate surface that wraps around the substrate edge to a portion of the substrate backside.

Figure 7:
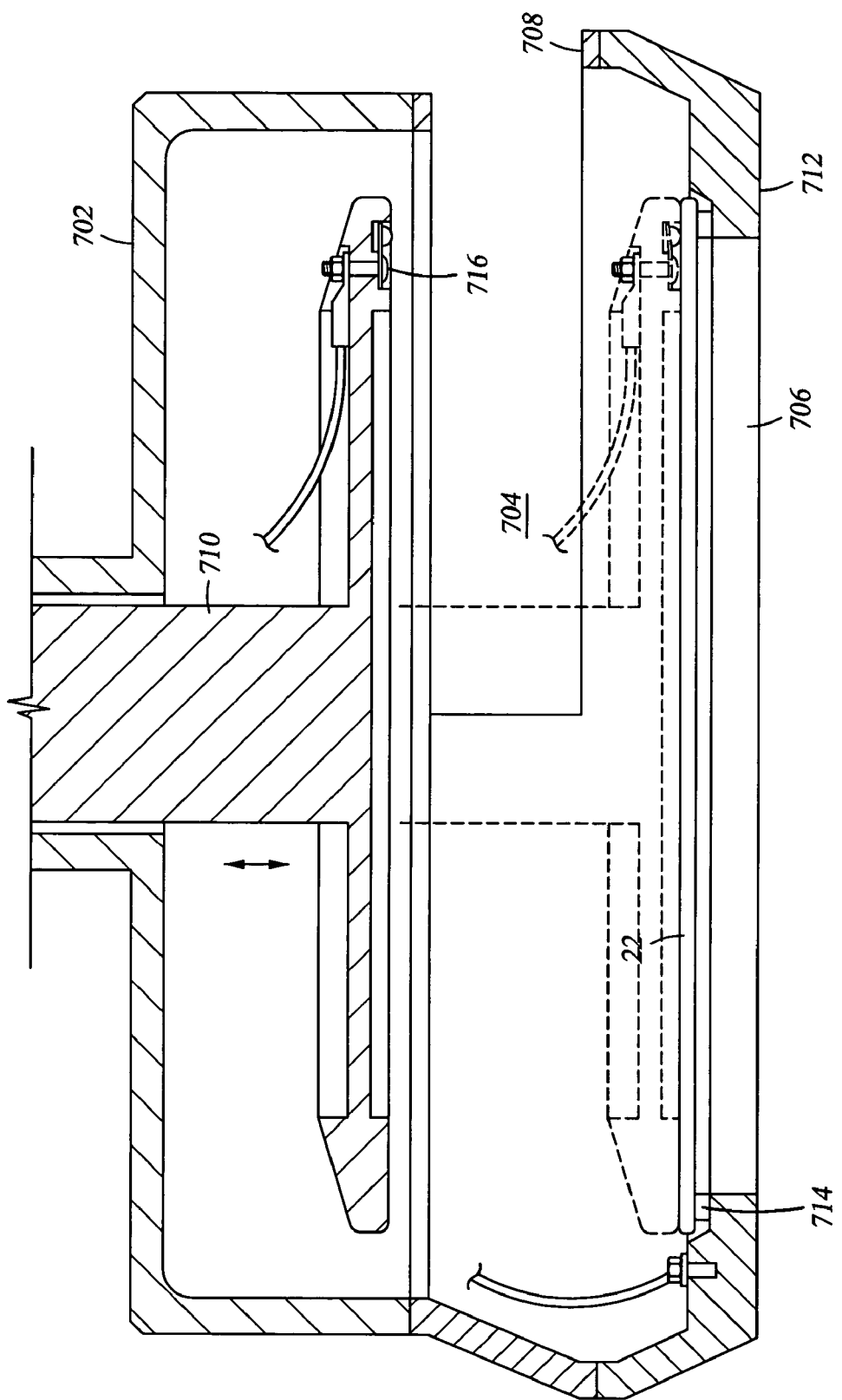
FIG. 7 depicts a partial view of another embodiment of a carrier head assembly.

FIG. 7 depicts another embodiment of a substrate carrier 700. The substrate carrier 700 generally includes a housing 702 defining a central cavity 704 that is open on a bottom 706 and through at least one port 708 disposed in the housing 702. The port 708 is typically sized to allow the substrate 22 carried by a robot (not shown) to be placed within the cavity 704. A thrust plate 710 is disposed in the housing 702 and may be actuated towards the bottom 706 of the housing 702. A ring 712 circumscribing the open portion of the bottom 706 includes a ledge 714 that supports the substrate 22 as the thrust plate 710 urges the substrate 22 against the ring 712. The ring 712 may provide the electrical contact to bias the substrate 22. Alternatively, the thrust plate 710 may alternatively include a contact plate 716 similar to the contact plate 602 described in reference to FIG. 6A & 6B.

Figure 8:
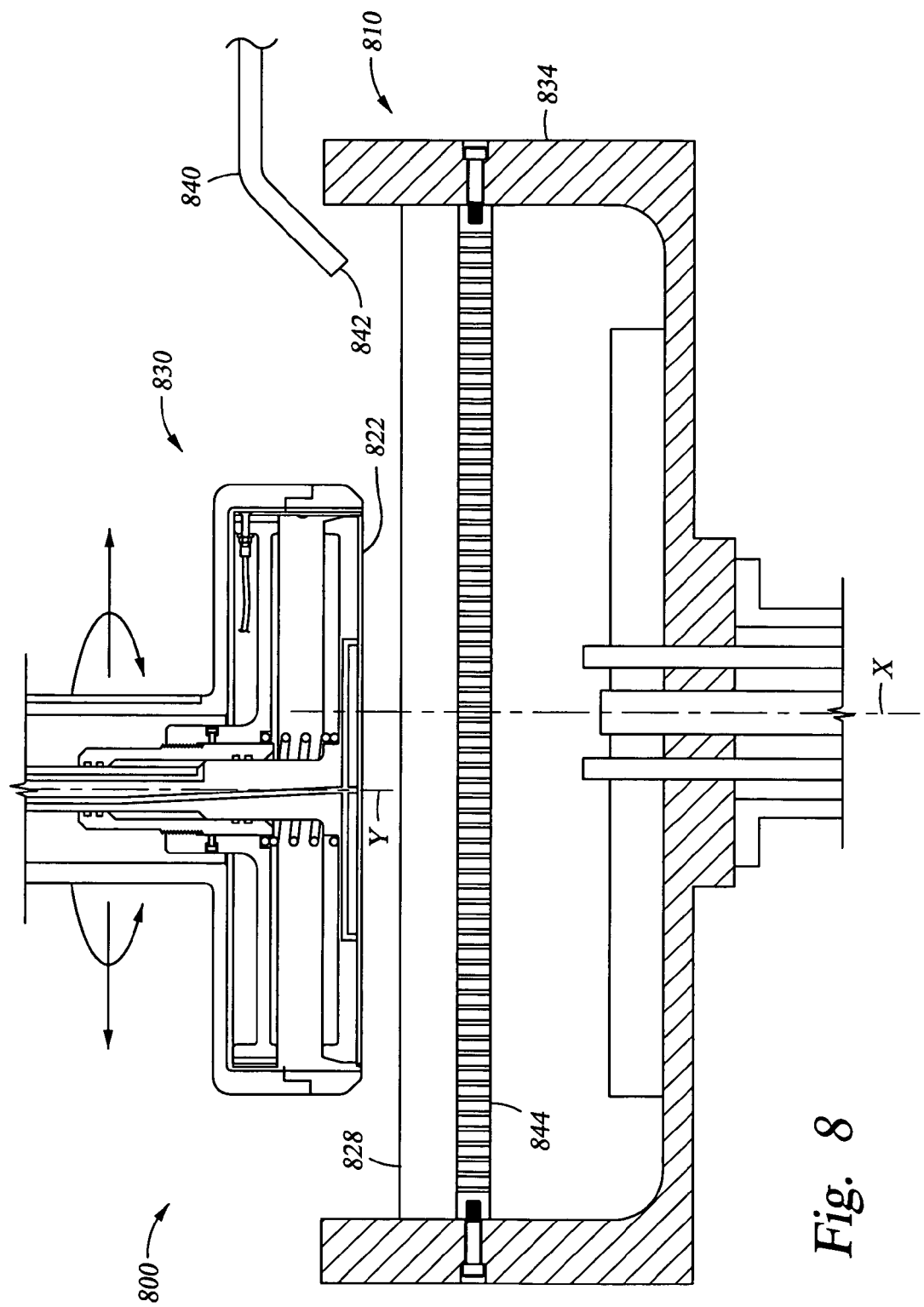
FIG. 8 is a cross sectional view of another embodiment of a processing apparatus of the invention showing a substrate disposed above a permeable disc.
Figure 9:
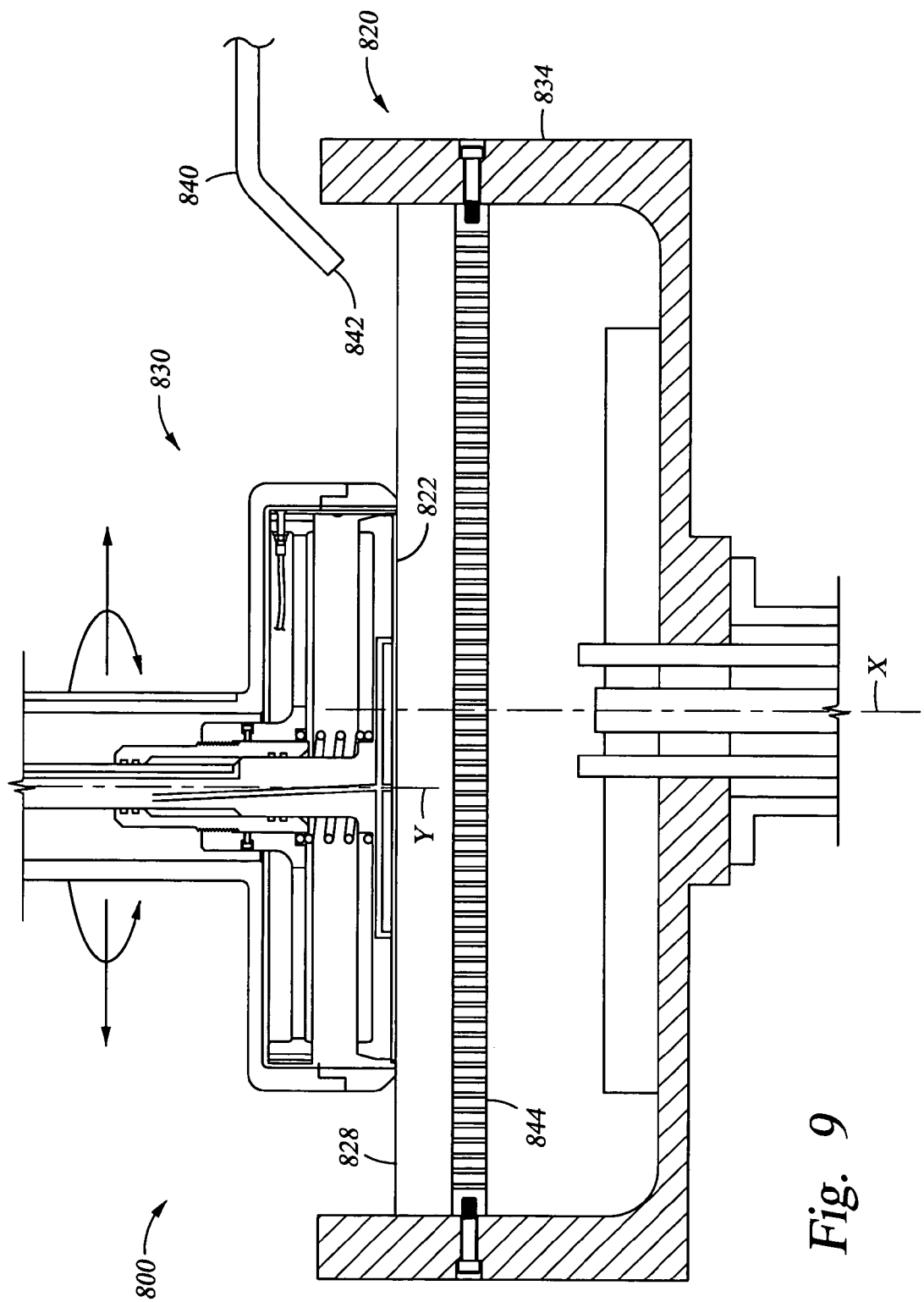
FIG. 9 is a cross sectional view of one embodiment of a processing apparatus of the invention showing a substrate disposed above or contacting a permeable disc

FIGS. 8 and 9 are cross sectional views of an alternative embodiment of an apparatus 800 of the invention for electroless deposition and polishing of a material on the substrate surface. An electroless deposition does not normally require the presence of an anode for deposition of a material. In the embodiment shown in FIGS. 8 and 9, similar components corresponding to those described in reference to FIG. 2 are shown and are further described as follows.

The apparatus 800 discloses an enclosure 834 which typically includes a diffuser plate 844 and a permeable disc 828 disposed therein in a first relative position 810 adjacent to but vertically displaced from substrate 822 disposed in carrier assembly 830 described above in FIG. 2. The permeable disc 828, such as a polishing pad, is disposed and supported in the electrolyte cell on the diffuser plate 844. The partial enclosure 834 can be a bowl shaped member made of a plastic such as fluoropolymers, TEFLON®, PFA, PE, PES, or other materials that are compatible with plating chemistries. The enclosure 834 generally defines a container or electrolyte cell in which an electrolyte or other polishing/deposition fluid can be confined. The electrolyte used in processing the substrate 22 can include metals such as copper, nickel or other materials which can be electroless deposited onto a substrate.

The electrolyte is circulated into and out of the enclosure 834 to provide sufficient concentration of material to the substrate surface for processing. The electrolyte is typically provided to the enclosure 834 via a fluid delivery line 840 having an outlet 842 positioned above the permeable disk 828. The electrolyte outlet from the enclosure 834 is not shown. In one aspect, the partial enclosure 834 can be initially filled with electrolyte prior to substrate processing and can then circulate the electrolyte into and out of the partial enclosure.

FIG. 8 shows the substrate 822 and the permeable disk 828 in a first position 810 generally relative to one another. The first position 810 typically has a distance between about 1 and about 5 mm between the permeable disk 828 and the substrate 822. In one aspect of the invention, a distance of about 2 mm between the permeable disk 828 and the substrate 822 is used.

FIG. 9 shows the permeable disk 828 and the substrate 822 adjacent to or in near contact with one another in the second position 820. The second position is generally about 100 μm or less, including contact, between the permeable disk 828 and the substrate 822.

Figure 10:
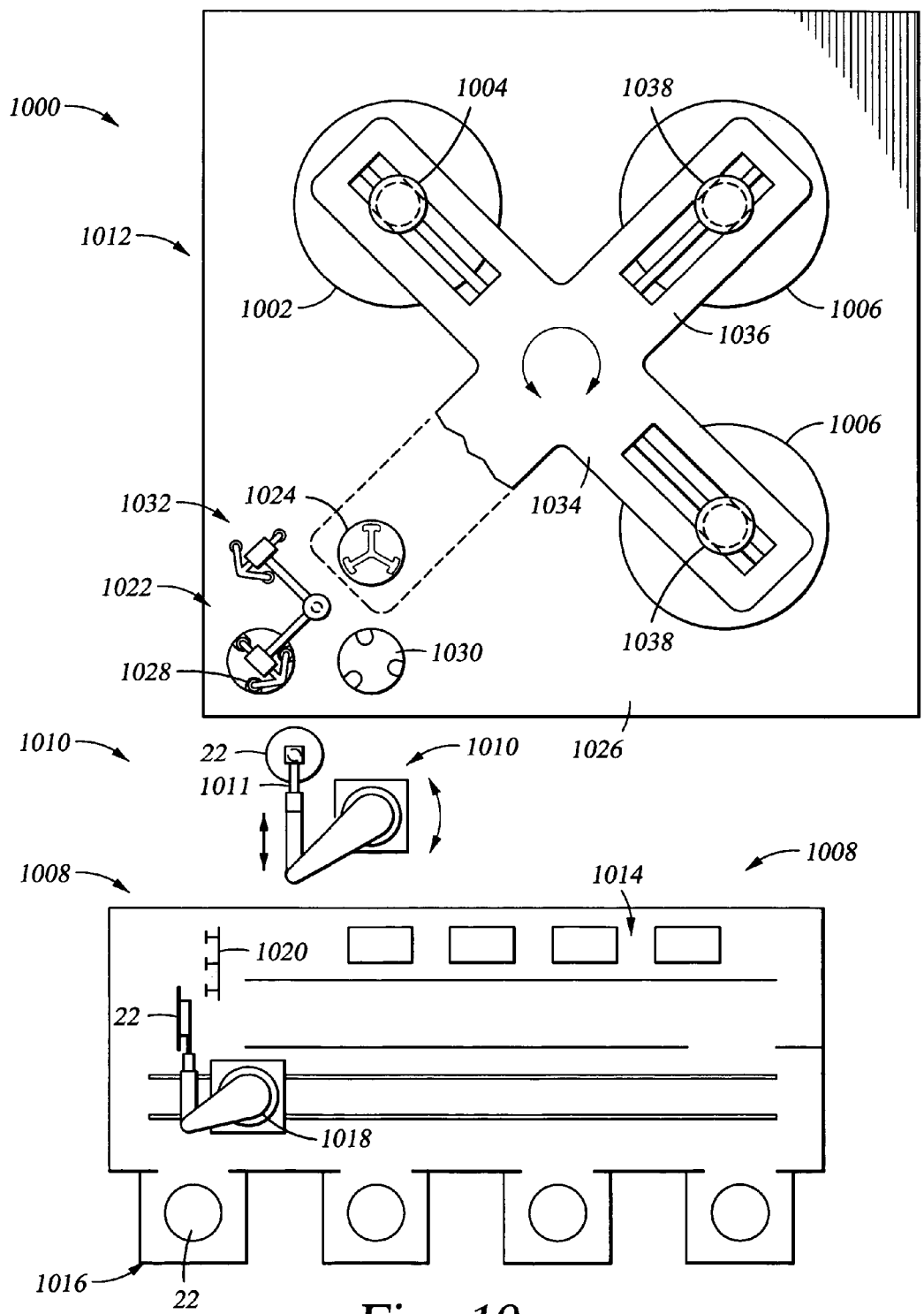
FIG. 10 is a plan view of one embodiment of a processing platform incorporating embodiments of the processing apparatus of the invention.
Figure 11:
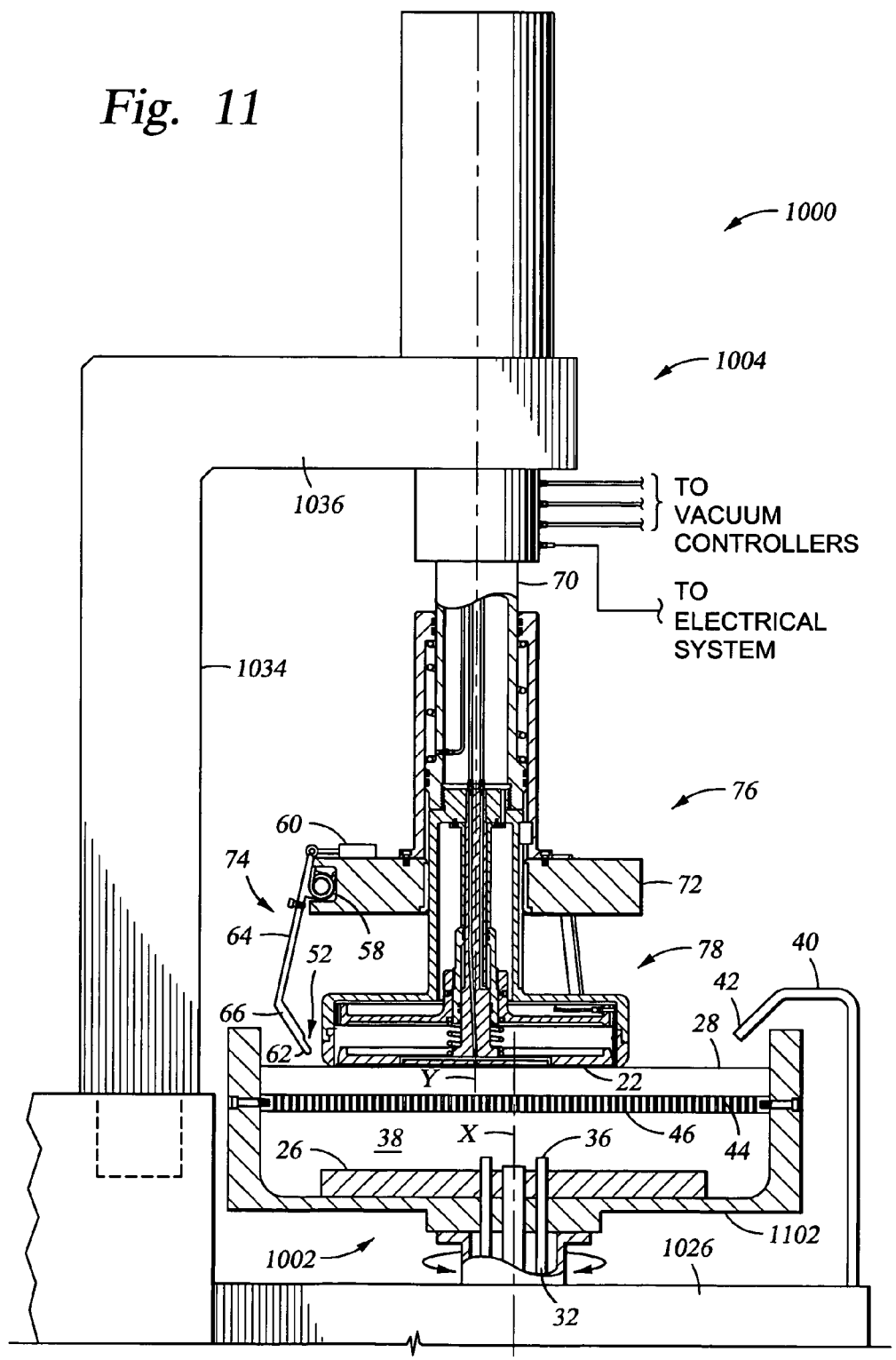
FIG. 11 is a sectional view of a plating station of the platform of FIG. 10.

FIGS. 10 and 11 depicts a processing apparatus 1000 having at least one plating station 1002 and at least one conventional polishing or buffing station 1006. One polishing tool that may be adapted to benefit from the invention is a MIRRA® chemical mechanical polisher available from Applied Materials, Inc. located in Santa Clara, Calif. The exemplary apparatus 1000 generally comprises a factory interface 1008, a loading robot 1010, and a depositing and planarizing module 1012. Generally, the loading robot 1010 is disposed proximate the factory interface 1008 and the depositing and planarizing module 1012 to facilitate the transfer of substrates 22 therebetween.

The factory interface 1008 generally includes a cleaning module 1014 and one or more wafer cassettes 1016. An interface robot 1018 is employed to transfer substrates 22 between the wafer cassettes 1016, the cleaning module 1014 and an input module 1020. The input module 1020 is positioned to facilitate transfer of substrates 22 between the depositing and planarizing module 1012 and the factory interface 1008 by the loading robot 1010. For example, unprocessed substrates 22 retrieved from the cassettes 1016 by the interface robot 1018 may be transferred to the input module 1020 where the substrates 22 may be accessed by the loading robot 1010 while processed substrates 22 returning from the depositing and planarizing module 1012 may be placed in the input module 1020 by the loading robot 1010. Processed substrates 22 are typically passed from the input module 1020 through the cleaning module 1014 before the factory interface robot 1018 returns the cleaned substrates 22 to the cassettes 1016. An example of such a factory interface 1008 that may be used to advantage is disclosed in U.S. patent application Ser. No. 09/547,189, filed Apr. 11, 2000, assigned to common assignee Applied Materials, Inc., and which is hereby incorporated by reference.

The loading robot 1010 is generally positioned proximate the factory interface 1008 and the depositing and planarizing module 1012 such that the range of motion provided by the robot 1010 facilitates transfer of the substrates 22 therebetween. An example of a loading robot 1010 is a 4-Link robot, manufactured by Kensington Laboratories, Inc., located in Richmond, Calif. The exemplary loading robot 1010 has a gripper 1011 that may orientate the substrate 22 in either a vertical or a horizontal orientation.

The exemplary depositing and planarizing module 1012 has a transfer station 1022 and a carousel 1034 in addition to the plating station 1002 and the polishing station 1006, all of which are disposed on a machine base 1026. The depositing and planarizing module 1012 may comprise one polishing module and two plating modules. Alternatively, the depositing and planarizing module 1012 may comprise one plating module and two polishing modules. In a further alternative, a polishing module 1120 may be provided for polishing a substrate following processing by the methods described herein or in the apparatus described herein.

In one embodiment, the transfer station 1022 comprises at least an input buffer station 1028, an output buffer station 1030, a transfer robot 1032, and a load cup assembly 1024. The loading robot 1010 places the substrate 22 onto the input buffer station 1028. The transfer robot 1032 has two gripper assemblies, each having pneumatic gripper fingers that grab the substrate 22 by the substrate's edge. The transfer robot 1032 lifts the substrate 22 from the input buffer station 1028 and rotates the gripper and substrate 22 to position the substrate 22 over the load cup assembly 1034, then places the substrate 22 down onto the load cup assembly 1024. An example of a transfer station that may be used to advantage is described by Tobin in U.S. patent application Ser. No. 09/414,771, U.S. Pat. No. 6,156,124, filed on Oct. 10, 1999, assigned to common assignee Applied Materials, Inc., and which is hereby incorporated by reference.

The carousel 1034 is generally described in U.S. Pat. No. 5,804,507, issued Sep. 8, 1998 to Tolles et al. and is hereby incorporated herein by reference in its entirety. Generally, the carousel 1034 is centrally disposed on the base 1026. The carousel 1034 typically includes a plurality of arms 1036. The arms 1036 generally each supporting a polishing head 1038 while one arm supports a carrier head assembly 1004. One of the arms 1036 depicted in FIG. 10 is shown in phantom such that the transfer station 1022 may be seen. The carousel 1034 is indexable such that the polishing head 1038 and carrier head 1004 may be moved between the modules 1002, 1006 and the transfer station 1022.

Generally the polishing head 1038 retains the substrate 22 while pressing the substrate against a polishing material (not shown) disposed on the polishing stations 1006. The polishing station 1006 generally rotates to provide a relative motion between the substrate 22 retained by the polishing head 1038 and the polishing material. Typically, a polishing fluid is provided to assist in the material removal from the substrate 22. One polishing head that may be utilized is a TITAN HEAD™ wafer carrier manufactured by Applied Materials, Inc., Santa Clara, Calif.

FIG. 11 depicts a sectional view of the substrate carrier head assembly 1004 supported above the plating station 1002. In one embodiment, the substrate carrier head assembly 1004 is substantially similar to the substrate carrier assembly 30 described above. Similarly, the plating station 1002 includes a partial enclosure 1102 that defines an electrolyte cell to facilitate metal deposition on the substrate 22 that is substantially similar to the enclosure 30 described above. The enclosure 1102 of the plating station 1002 is coupled to a motor that provides rotation of the enclosure 1102.

The arrangement of the plating stations 1002 and polishing stations 1006 on the depositing and planarizing module 1012 allow for the substrate 22 to be sequentially plated or polishing by moving the substrate between stations. The substrate 22 may be processed in each station 1002, 1006 while remaining in it respective head or carrier 1038, 1004, or the substrate may be switched between heads by offloading the substrate from one head into the load cup and loading into the substrate into the other polishing head. Optionally, the depositing and planarizing module 1012 may comprise only one type of head may be utilized (i.e., all polishing heads 1038 or all carrier heads 1004).

Figure 12:
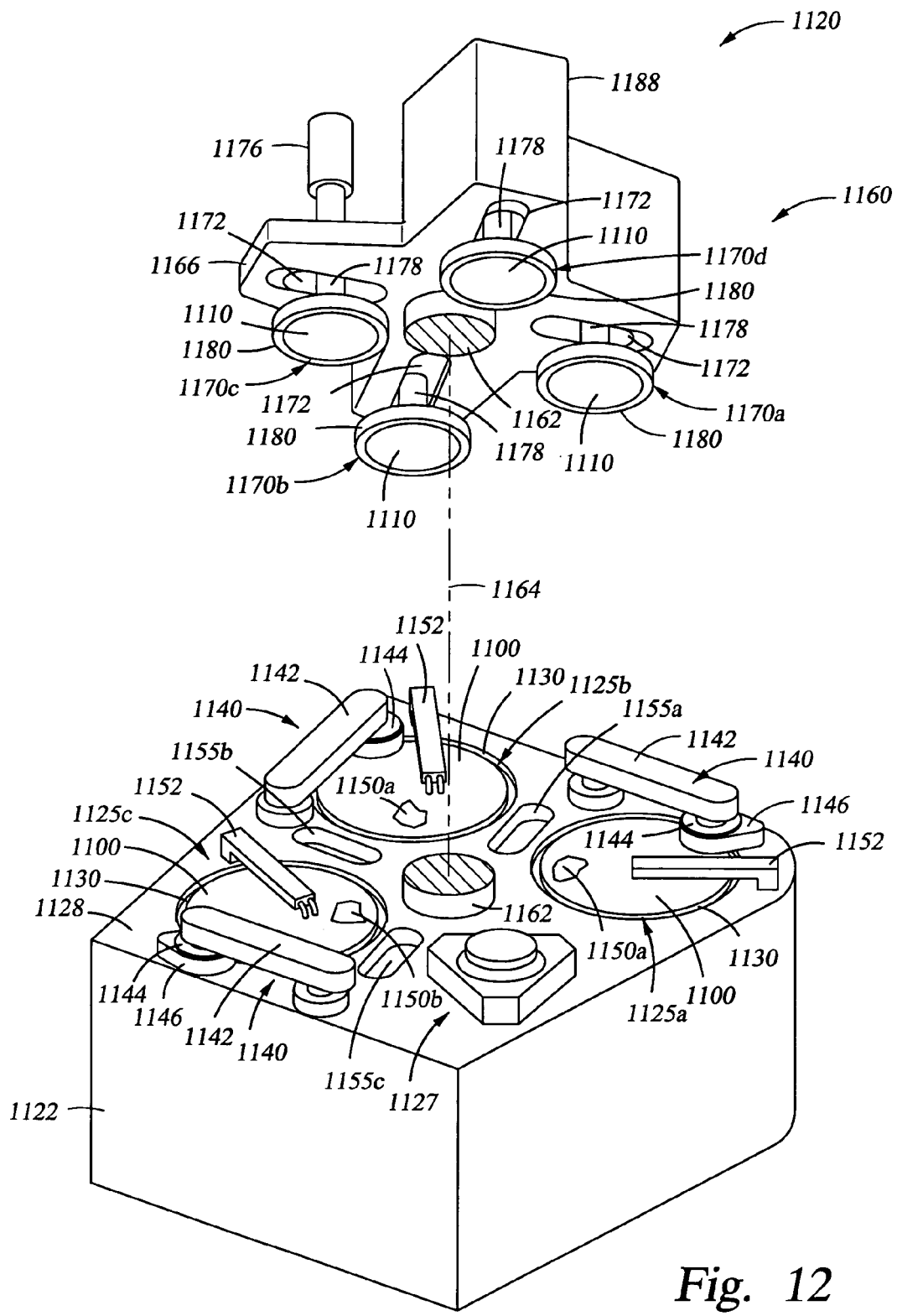
FIG. 12 is a schematic perspective view of a chemical mechanical polishing apparatus.

FIG. 12 is a schematic perspective view of a chemical mechanical polishing apparatus 1120 for further processing substrate following processing by the method described herein or in the apparatus described herein. The polishing apparatus 1120 includes a lower machine base 1122 with a table top 1128 mounted thereon and a removable outer cover (not shown). The table top 1128 supports a series of polishing stations, including a first polishing station 1125a, a second polishing station 1125b, a final polishing station 1125c, and a transfer station 1127. The transfer station 1127 serves multiple functions, including, for example, receiving individual substrates 1110 from a loading apparatus (not shown), washing the substrates, loading the substrates into carrier heads 1180, receiving the substrates 1110 from the carrier heads 1180, washing the substrates 1110 again, and transferring the substrates 1110 back to the loading apparatus.

Each polishing station 1125a-1125c includes a rotatable platen 1130 having a polishing pad 1100 disposed thereon. Each platen 1130 may be a rotatable aluminum or stainless steel plate connected to a platen drive motor (not shown). The polishing pads 1100 may comprise a conventional polishing or a fixed abrasive polishing pad, e.g., a polishing pad comprising abrasive particle in a binder polymeric material. Alternatively, an abrasive slurry may be provided to a conventional polishing pad for processing. Further, an abrasive free composition may be applied to convention pad to enact polishing of a substrate disposed thereon.

The polishing stations 1125a-1125c may include a pad conditioner apparatus 1140. The pad conditioner apparatus 1140 has a rotatable arm 1142 holding an independently rotating conditioner head 1144 and an associated washing basin 1146. The pad conditioner apparatus 1140 maintains the condition of the polishing pad so that it will effectively polish the substrates. Each polishing station may include a conditioning station if the CMP apparatus is used with other pad configurations.

The polishing stations 1125a-1125c may each have a slurry/rinse arm 1152 that includes two or more supply tubes to provide one or more chemical slurries and/or water to the surface of the polishing pad. The slurry/rinse arm 1152 delivers the one or more chemical slurries in amounts sufficient to cover and wet the entire polishing pad. Each slurry/rinse arm 1152 also includes several spray nozzles (not shown) that can provide a high-pressure fluid rinse on to the polishing pad at the end of each polishing and conditioning cycle. Furthermore, two or more intermediate washing stations 1155a, 1155b, and 1155c may be positioned between adjacent polishing stations 1125a, 1125b, and 1125c to clean the substrate as it passes from one station to the next.

A rotatable multi-head carousel 1160 is positioned above the lower machine base 1122. The carousel 1160 includes four carrier head systems 1170a, 1170b, 1170c, and 1170d. Three of the carrier head systems receive or hold the substrates 1110 by pressing them against the polishing pads 1100 disposed on the polishing stations 1125a-1125c. One of the carrier head systems 1170a-1170d receives a substrate from and delivers a substrate 1110 to the transfer station 1127. The carousel 1160 is supported by a center post 1162 and is rotated about a carousel axis 1164 by a motor assembly (not shown) located within the machine base 1122. The center post 1162 also supports a carousel support plate 1166 and a cover 1168.

The four carrier head systems 1170a-1170d are mounted on the carousel support plate 1166 at equal angular intervals about the carousel axis 1164. The center post 1162 allows the carousel motor to rotate the carousel support plate 1166 and orbit the carrier head systems 1170a-1170d about the carousel axis 1164. Each carrier head system 1170a-1170d includes one carrier head 1180. A carrier drive shaft 1178 connects a carrier head rotation motor 1176 (shown by the removal of one quarter of the cover 1168) to the carrier head 1180 so that the carrier head 1180 can independently rotate about its own axis. There is one carrier drive shaft 1178 and motor 1176 for each head 1180. In addition, each carrier head 1180 independently oscillates laterally in a radial slot 1172 formed in the carousel support plate 1166.

The carrier head 1180 performs several mechanical functions. Generally, the carrier head 1180 holds the substrate 1110 against the polishing pad 1100, evenly distributes a downward pressure across the back surface of the substrate 1110, transfers torque from the drive shaft 1178 to the substrate 1110, and ensures that the substrate 1110 does not slip out from beneath the carrier head 1180 during polishing operations.

In one embodiment of the apparatus 1120, the table top 1128 supports a series of polishing stations, including a first polishing station 1125a adapted for polishing or removing residual material, such as copper, deposited to fill features formed on a substrate surface, a second polishing station 1125b adapted for polishing or removing barrier layer material, such as tantalum or tantalum nitride from a substrate surface, and a final polishing station 1125c adapted for buffing the substrate surface to remove surface defects formed on the substrate surface. Additionally, a cleaning module 1014 may be disposed on or adjacent to the apparatus 1120 for further treatment to remove surface defects formed during substrate processing and handling.

The invention claimed is:

1. A method of processing a substrate, comprising:
   a) positioning the substrate in a partial enclosure containing an electrolyte solution, wherein the substrate is positioned a first distance from a permeable disc disposed in the electrolyte;
   b) applying a current to a surface of the substrate exposed to the electrolyte and depositing a material on the substrate while rotating the partial enclosure; and
   c) positioning the substrate a second distance from the permeable disc, the second distance being less than the first distance.

2. The method of claim 1, wherein the electrolyte is a copper containing solution.

3. The method of claim 2, wherein less than 5000 angstroms of material is deposited at the first distance.

4. The method of claim 1, wherein the current is applied in a range from about 20 amps or less.

5. The method of claim 1, wherein the permeable disc is a polishing pad.

6. The method of claim 5, wherein applying the current to the substrate comprises the use of a pulse plating technique.

7. The method of claim 1, wherein the first distance is between about 1 mm and about 5 mm.

8. The method of claim 7, wherein the second distance is less than about 100 µm.

9. The method of claim 7, wherein the substrate and the permeable disk are in contact at the second distance.

10. The method of claim 9, wherein the permeable disk exerts a pressure on the substrate of about 2 psi or less at the second distance.

11. The method of claim 1, further comprising transferring the substrate to a polishing apparatus.

12. The method of claim 1, wherein the current is applied in a range between about 0.5 amps and about 5.0 amps.

13. A method of processing a substrate, comprising:
   positioning the substrate in a partial enclosure containing an electrolyte solution, wherein the substrate is positioned a first distance from a permeable disc disposed in the electrolyte; and
   applying a current to a surface of the substrate exposed to the electrolyte and depositing a material on the substrate while rotating the partial enclosure.

14. The method of claim 13, wherein the electrolyte is a copper containing solution.

15. The method of claim 13, wherein less than 5000 angstroms of material is deposited at the first distance.

16. The method of claim 13, wherein the current is applied in a range from about 20 amps or less.

17. The method of claim 13, wherein the permeable disc is a polishing pad.

18. The method of claim 13, further comprising transferring the substrate to a polishing apparatus.

19. The method of claim 13, wherein the current is applied in a range between about 0.5 amps and about 5.0 amps.

* * * * *